United States Patent
Huang et al.

(10) Patent No.: US 11,923,243 B2
(45) Date of Patent: Mar. 5, 2024

(54) SEMICONDUCTOR STRUCTURE HAVING AIR GAPS AND METHOD FOR MANUFACTURING THE SAME

(71) Applicant: TAIWAN SEMICONDUCTOR MANUFACTURING COMPANY, LTD., Hsinchu (TW)

(72) Inventors: Hsin-Yen Huang, Hsinchu (TW); Ting-Ya Lo, Hsinchu (TW); Shao-Kuan Lee, Hsinchu (TW); Chi-Lin Teng, Hsinchu (TW); Cheng-Chin Lee, Hsinchu (TW); Shau-Lin Shue, Hsinchu (TW); Hsiao-Kang Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 218 days.

(21) Appl. No.: 17/460,628

(22) Filed: Aug. 30, 2021

(65) Prior Publication Data
US 2023/0068760 A1   Mar. 2, 2023

(51) Int. Cl.
*H01L 21/768* (2006.01)
*H01L 21/02* (2006.01)
*H01L 21/306* (2006.01)

(52) U.S. Cl.
CPC .... *H01L 21/7682* (2013.01); *H01L 21/76831* (2013.01); *H01L 21/76865* (2013.01); *H01L 21/76877* (2013.01); *H01L 21/02167* (2013.01); *H01L 21/30617* (2013.01)

(58) Field of Classification Search
CPC .......... H01L 21/7682; H01L 21/76831; H01L 21/76832; H01L 21/76897; H01L 21/76877; H01L 21/76865; H01L 21/02167; H01L 21/30617; H01L 23/53295
See application file for complete search history.

(56) References Cited

U.S. PATENT DOCUMENTS

| | | | |
|---|---|---|---|
| 9,368,362 B2 * | 6/2016 | Rha | H01L 21/76826 |
| 10,665,546 B1 * | 5/2020 | Lin | H01L 21/76826 |
| 11,183,421 B2 * | 11/2021 | Hsieh | H01L 23/5222 |
| 2009/0298282 A1 * | 12/2009 | Yun | H01L 21/7682 438/653 |

(Continued)

*Primary Examiner* — Jaehwan Oh
*Assistant Examiner* — John M Parker
(74) *Attorney, Agent, or Firm* — Birch, Stewart, Kolasch & Birch, LLP

(57) ABSTRACT

A method for manufacturing a semiconductor structure includes preparing a dielectric structure formed with trenches respectively defined by lateral surfaces of the dielectric structure, forming spacer layers on the lateral surfaces, filling an electrically conductive material into the trenches to form electrically conductive features, selectively depositing a blocking layer on the dielectric structure, selectively depositing a dielectric material on the electrically conductive features to form a capping layer, removing the blocking layer and the dielectric structure to form recesses, forming sacrificial features in the recesses, forming a sustaining layer to cover the sacrificial features; and removing the sacrificial features to obtain the semiconductor structure formed with air gaps confined by the sustaining layer and the spacer layers.

20 Claims, 30 Drawing Sheets

(56) References Cited

U.S. PATENT DOCUMENTS

| | | | |
|---|---|---|---|
| 2009/0309230 A1* | 12/2009 | Cui | H01L 23/53238 257/773 |
| 2010/0181678 A1* | 7/2010 | Edelstein | H01L 21/76883 430/311 |
| 2012/0319279 A1* | 12/2012 | Isobayashi | H01L 23/53238 438/653 |
| 2013/0323930 A1* | 12/2013 | Chattopadhyay | H01L 21/76829 156/345.26 |
| 2017/0162431 A1* | 6/2017 | Ahn | H01L 21/31116 |
| 2020/0185264 A1* | 6/2020 | Lin | H01L 21/7682 |
| 2021/0193566 A1* | 6/2021 | Lo | H01L 23/5384 |

\* cited by examiner

SEMICONDUCTOR STRUCTURE HAVING AIR GAPS AND METHOD FOR MANUFACTURING THE SAME

BACKGROUND

The integration density of various electronic components, such as transistors, diodes, resistors, capacitors, etc., is being improved continuously in the semiconductor industry by continual reduction in minimum feature sizes. As the feature sizes are decreased, the distance between metal features is continually reduced. As the distance between the metal features reduces, the resulting parasitic capacitance between the metal features increases, leading to higher power consumption and larger resistance-capacitance (RC) time delays for an integrated chip. To improve performance and reduce the parasitic capacitance between the metal features, materials having low dielectric (k) values are used. For example, dielectric materials, such as silicon oxide or other low-k dielectrics, are used. Such dielectric materials have a k-value ranging from about 2.5 to 4. However, such dielectric materials encounter a lot of processing problems that prevent further improvement of the dielectric constant.

The use of air gaps in semiconductor devices to enhance the isolation of the metal features is known in the art of semiconductor fabrication. Since air has a lowest k value (k=1), a growing trend has been to incorporate air gaps into the semiconductor devices to isolate the metal features and reduce line-to-line capacitance and the RC time delay.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
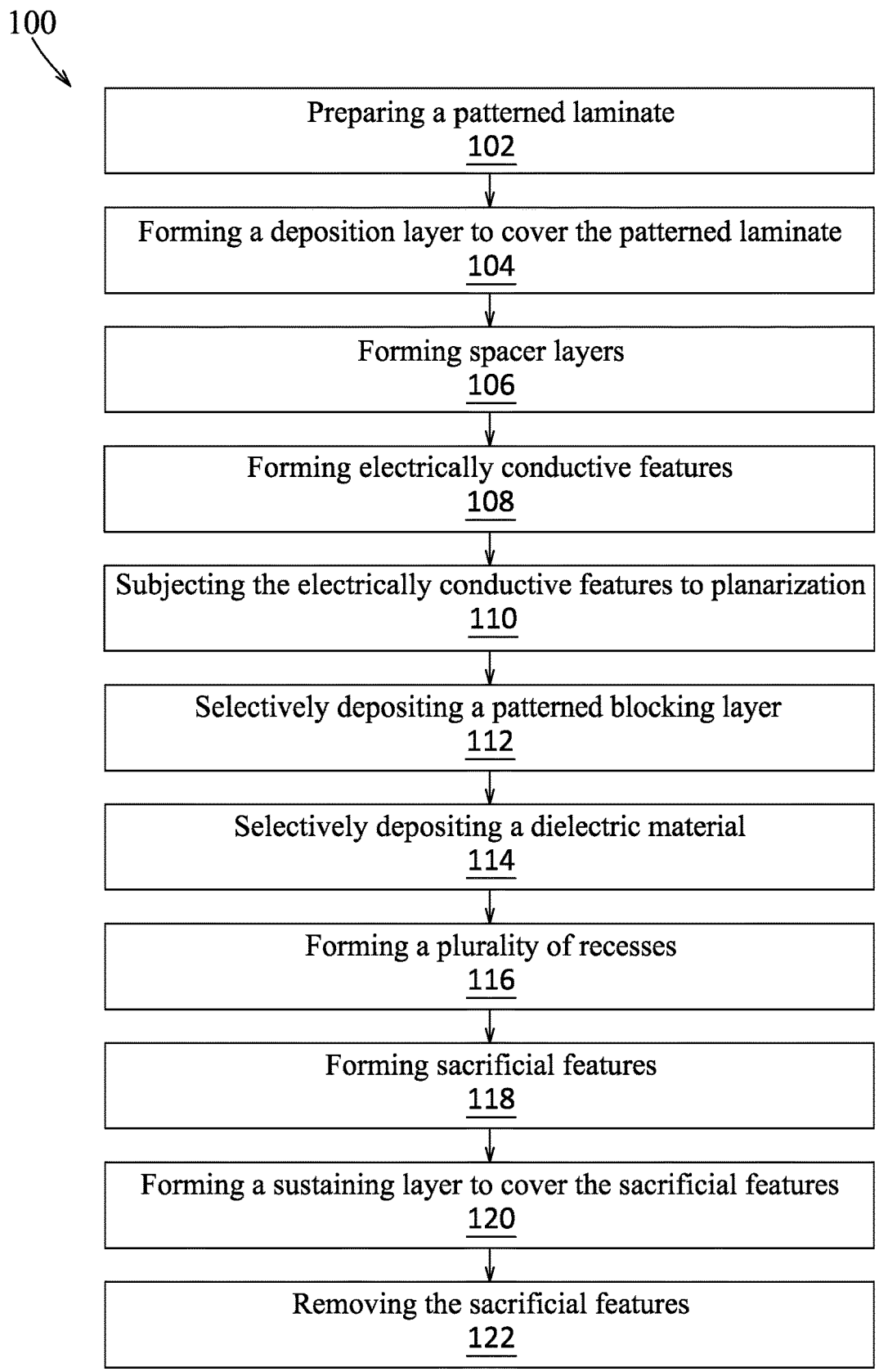
FIG. 1 is a flow diagram illustrating a method for manufacturing a semiconductor structure having air gaps in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "downwardly" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a method 100 for manufacturing a semiconductor structure having air gaps in accordance with some embodiments. FIGS. 2 to 15 illustrate schematic views of a semiconductor structure 200 during various stages of the method 100 of FIG. 1. The method 100 and the semiconductor structure 200 are collectively described below. However, additional steps can be provided before, after or during the method 100, and some of the steps described herein may be replaced by other steps or be eliminated. Similarly, further additional features may be present in the semiconductor structure 200, and/or features present may be replaced or eliminated in additional embodiments.

Figure 2:
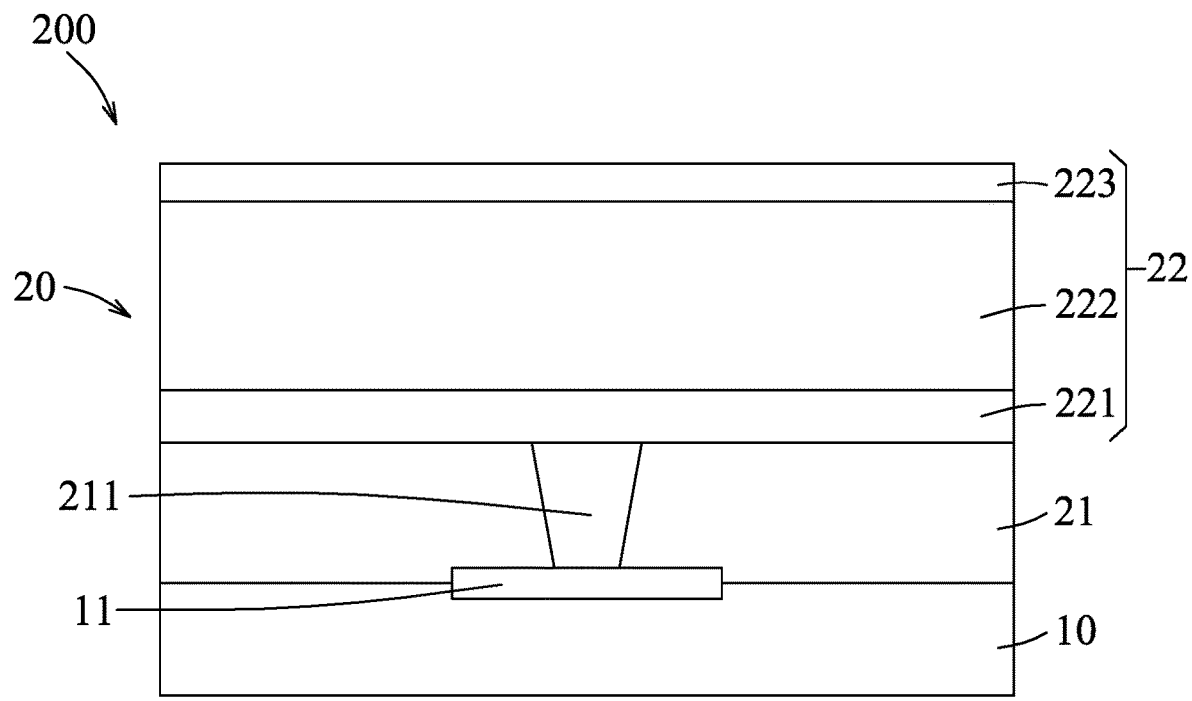
FIGS. 2 to 15 illustrate schematic views showing intermediate stages of the method for manufacturing a semiconductor structure having air gaps as depicted in FIG. 1.
Figure 3:
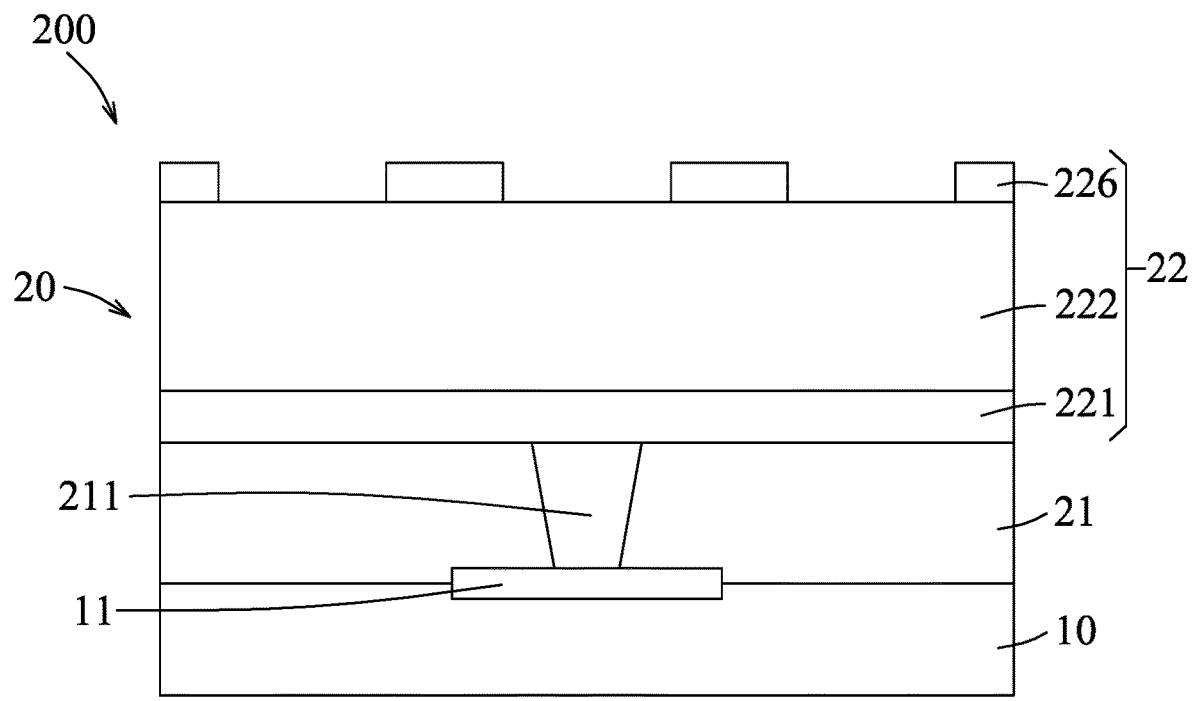
Figure 4:
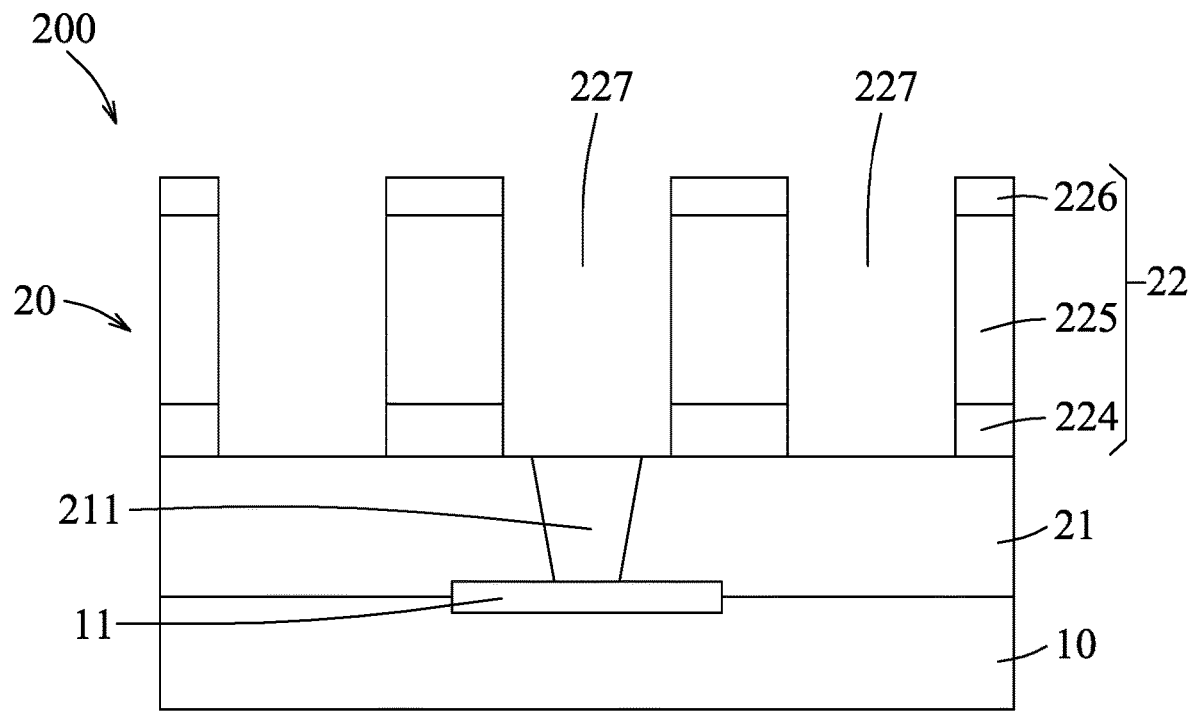

Referring to FIG. 1, the method 100 begins at block 102, where a patterned laminate is prepared. Referring to the example illustrated in FIGS. 2 to 4, a patterned laminate 20 is prepared on a substrate 10. Specifically, referring to FIG. 2, an etch stop layer 221, a dielectric layer 222, and a mask layer 223 (for example, a hard mask layer) are deposited sequentially on an interconnect layer 21 formed on the substrate 10. Referring to FIGS. 2 and 3, the mask layer 223 is subjected to patterning to form a patterned mask layer 226. Referring to FIGS. 3 and 4, the dielectric layer 222 and the etch stop layer 221 are subjected to etching sequentially through the patterned mask layer 226 to form a patterned dielectric layer 225 and a patterned etch stop layer 224, respectively. The patterned laminate 20 includes the interconnect layer 21 disposed on the substrate 10 and a dielectric structure 22 disposed on the interconnect layer 21. The dielectric structure 22 is formed with trenches 227 respectively defined by lateral surfaces of the dielectric structure 22, and includes the patterned etch stop layer 224 disposed on the interconnect layer 21, the patterned dielectric layer 225 disposed on the patterned etch stop layer 224, and the patterned mask layer 226 disposed on the patterned dielectric layer 225.

The deposition of the etch stop layer 221, the dielectric layer 222, and the mask layer 223 may be implemented by a suitable deposition process independently selected from physical vapor deposition (PVD), chemical vapor deposition (CVD), plasma-enhanced chemical vapor deposition (PECVD), atomic layer deposition (ALD), plasma-enhanced atomic layer deposition (PEALD), etc., or combinations thereof, but not limited thereto.

The patterning for forming the patterned mask layer 226 may be implemented using photolithography and photoresist developing technology as is known to those skilled in the art of semiconductor fabrication. For example, the patterned mask layer 226 may be formed from the mask layer 223 by 193 nm immersion lithography or extreme ultraviolet (EUV) lithography. The pattern formed in the patterned mask layer 226 is then transferred to the dielectric layer 222 and the etch stop layer 221 by an etching treatment (for example, wet etching) so as to form the dielectric structure 22.

In some embodiments, the substrate 10 may be a semiconductor substrate, e.g., an elemental semiconductor or a compound semiconductor. An elemental semiconductor is composed of single species of atoms, such as silicon (Si) or germanium (Ge) in column IV of the periodic table. A compound semiconductor is composed of two or more elements, such as silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or the like. The compound semiconductor may have a gradient feature in which the composition thereof changes from one ratio at one location to another ratio at another location in the compound semiconductor. The compound semiconductor may be formed over a silicon substrate. The compound semiconductor may be strained. In some embodiments, the substrate 10 may include a multi-layer compound semiconductor structure. Alternatively, the substrate 10 may include a non-semiconductor material, such as a glass, fused quartz, or calcium fluoride. Furthermore, in some embodiments, the substrate 10 may be a semiconductor on insulator (SOI) (e.g., silicon germanium on insulator (SGOI)). Generally, an SOI substrate includes a layer of a semiconductor material such as epitaxial silicon (Si), germanium (Ge), silicon germanium (SiGe), or combinations thereof. The substrate may be doped with a p-type dopant, such as boron (Br), aluminum (Al), gallium (Ga), or the like, or may alternatively be doped with an n-type dopant, as is known in the art. In some embodiments, the substrate 10 may include a doped epitaxial layer. Shallow trench isolation (STI) regions (not shown) may be formed in the substrate 10 to isolate active regions (one is schematically shown in FIG. 2 with the numeral 11), such as source or drain regions of an integrated circuit device (not shown) in the substrate 10. In some embodiments, the integrated circuit device may include complementary metal-oxide semiconductor (CMOS) transistors, planar or vertical multi-gate transistors (e.g., FinFET devices), gate-all-around (GAA) devices, resistors, capacitors, diodes, transistors (e.g., field-effect transistors (FETs)), interconnections, or the like, based on practical applications. In addition, through-vias (not shown) may be formed to extend into the substrate 10 for electrically connecting features on opposite sides of the substrate 10.

In some embodiments, the interconnect layer 21 includes an interconnect 211 (for example, electrically conductive via contact) which is electrically connected to the active region 11. The interconnect layer 21 may be made of a dielectric material, such as silicon oxide, SiOC-based materials (e.g., SiOCH), borophosphosilicate glass (BPSG), undoped silicate glass (USG), fluorinated silicate glass (FSG), high-density plasma (HDP) oxide, plasma-enhanced TEOS (PE-TEOS), fluorine-doped silicon oxide, carbon-doped silicon oxide, porous silicon oxide, porous carbon-doped silicon oxide, organic polymers, or silicone based polymers. In some embodiments, silicon oxide may be formed from tetraethyl orthosilicate (TEOS). The interconnect layer 21 may be formed on the substrate 10 by a suitable deposition process as is known to those skilled in the art of semiconductor fabrication, for example, ALD, CVD, PVD, or combinations thereof.

Materials suitable for forming the etch stop layer 221 include, for example, aluminum compounds (for example, aluminum nitride, aluminum oxynitride, aluminum oxide, etc.), silicon compounds (for example, silicon oxycarbide, silicon carbonitride, silicon nitride, silicon oxycarbonitride, silicon oxide, silicon carbide, silicon oxynitride, etc.), and combinations thereof, but are not limited thereto. The etch stop layer may have a thickness ranging from 5 Å to 200 Å.

Materials suitable for forming the dielectric layer 222 include, for example, silicon-based compounds, such as silicon oxide, silicon nitride, silicon carbide, silicon oxycarbide, silicon oxynitride, silicon carbonitride, silicon oxycarbonitride, other low-k dielectrics (e.g., porous SiOC), and combinations thereof, but are not limited thereto.

Materials suitable for forming the mask layer 223 include, for example, silicon oxide, silicon nitride, silicon carbide, silicon oxycarbide, silicon oxynitride, silicon carbonitride, silicon oxycarbonitride, cobalt, ruthenium, tungsten, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, and combinations thereof, but are not limited thereto.

The method 100 then proceeds to block 104 wherein a deposition layer is formed to cover the patterned laminate. Referring to the example illustrated in FIG. 5, the patterned laminate 20 is subjected to deposition of a first low-k dielectric material thereon to conformally form a deposition layer 30 (for example, a conformal deposition layer) covering the patterned laminate 20. The deposition may be implemented by a suitable deposition process as is known to those skilled in the art of semiconductor fabrication, for example, PVD, CVD, PECVD, ALD, PEALD, etc., or combinations thereof, but not limited thereto. For example, the deposition may be implemented by ALD at a temperature ranging from 50° C. to 400 ° C. Examples of the first low-k dielectric material suitable for forming the deposition layer 30 include, for example, aluminum compounds (for example, aluminum nitride, aluminum oxynitride, aluminum oxide, etc.), silicon compounds (for example, silicon oxycarbide, silicon carbonitride, silicon nitride, silicon oxycarbonitride, silicon oxide, silicon carbide, silicon oxynitride, etc.), or combinations thereof, but are not limited thereto. The first low-k dielectric material selected for forming the deposition layer 30 is different from the material selected for forming the etch stop layer 221. For example, the aluminum compound is used for forming the deposition layer 30, and the silicon compound is used for forming the etch stop layer 221. The deposition layer 30 may have a thickness ranging from 5 Å to 200 Å.

Figure 5:
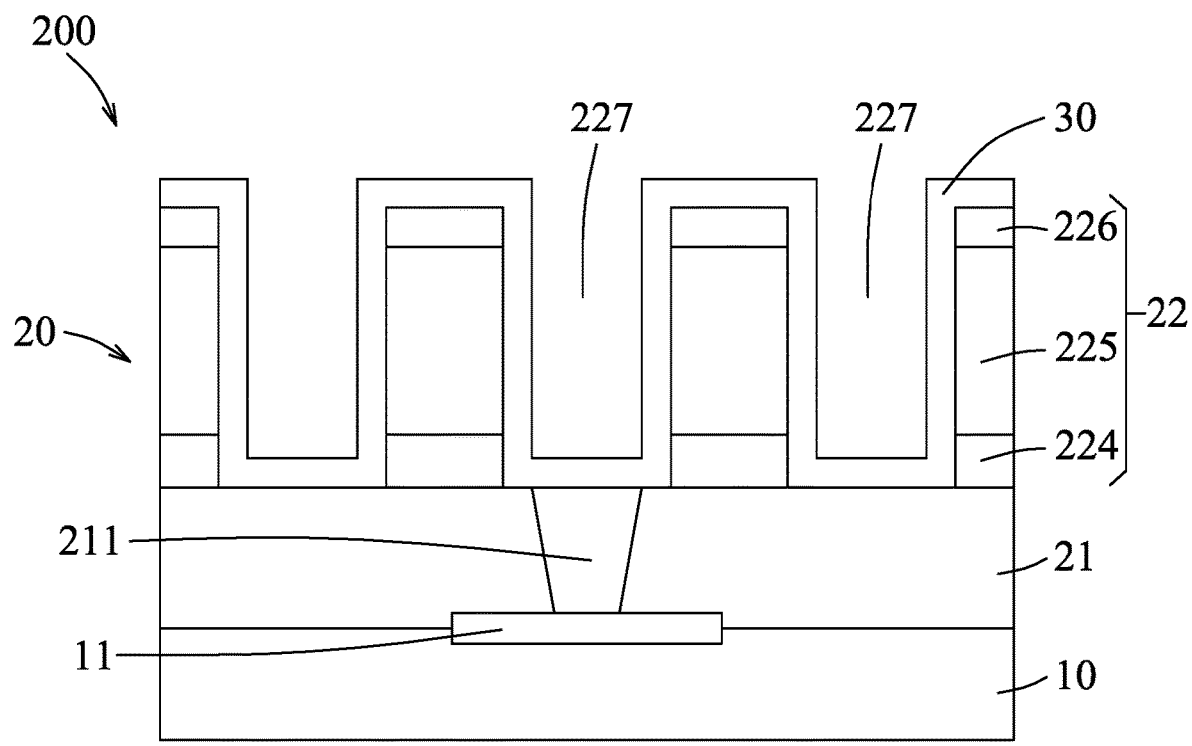
Figure 6:
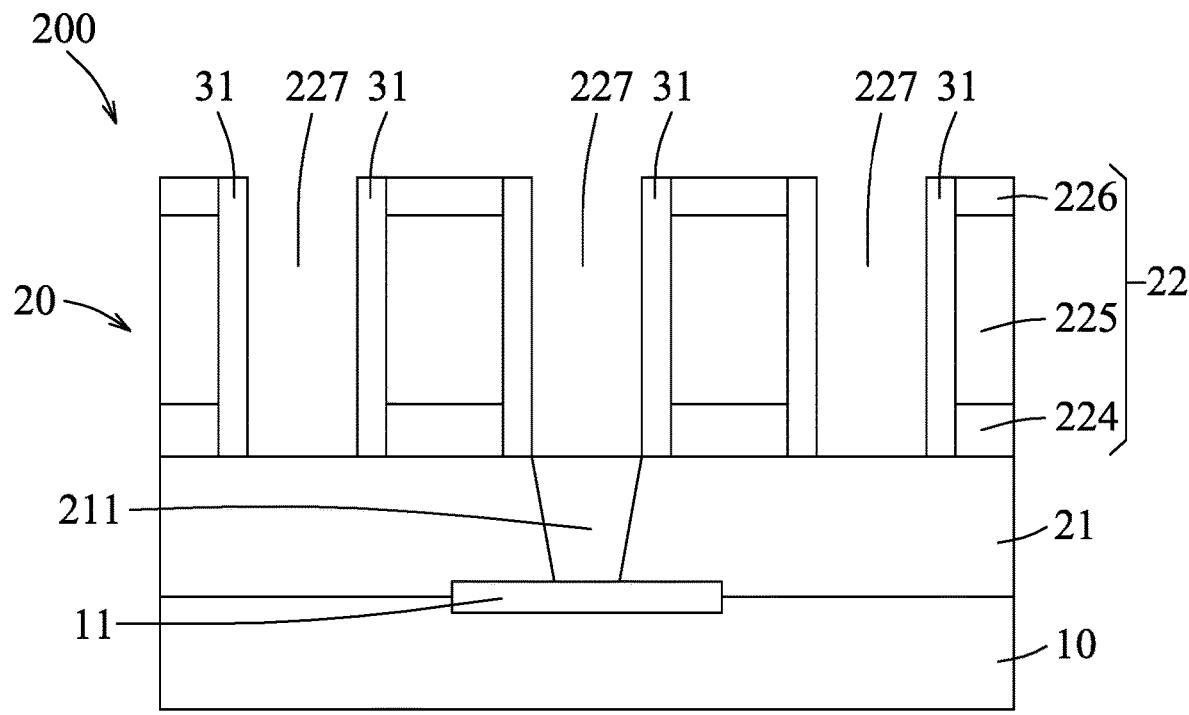
Figure 7:
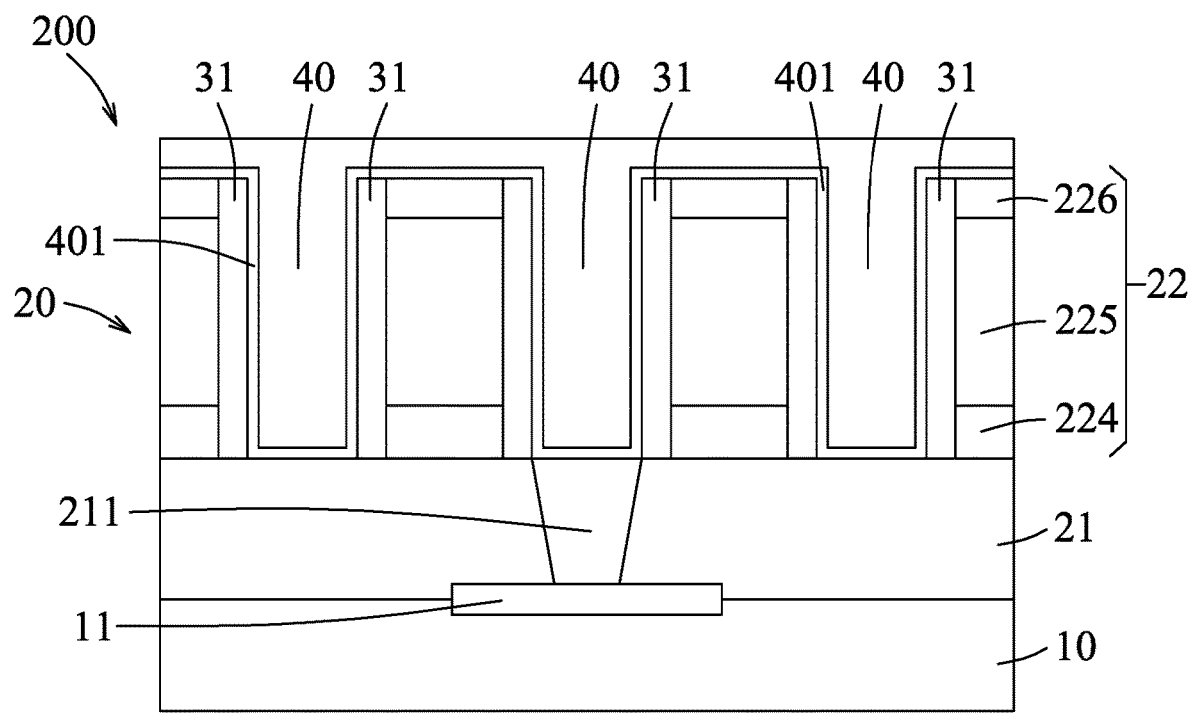
Figure 8:
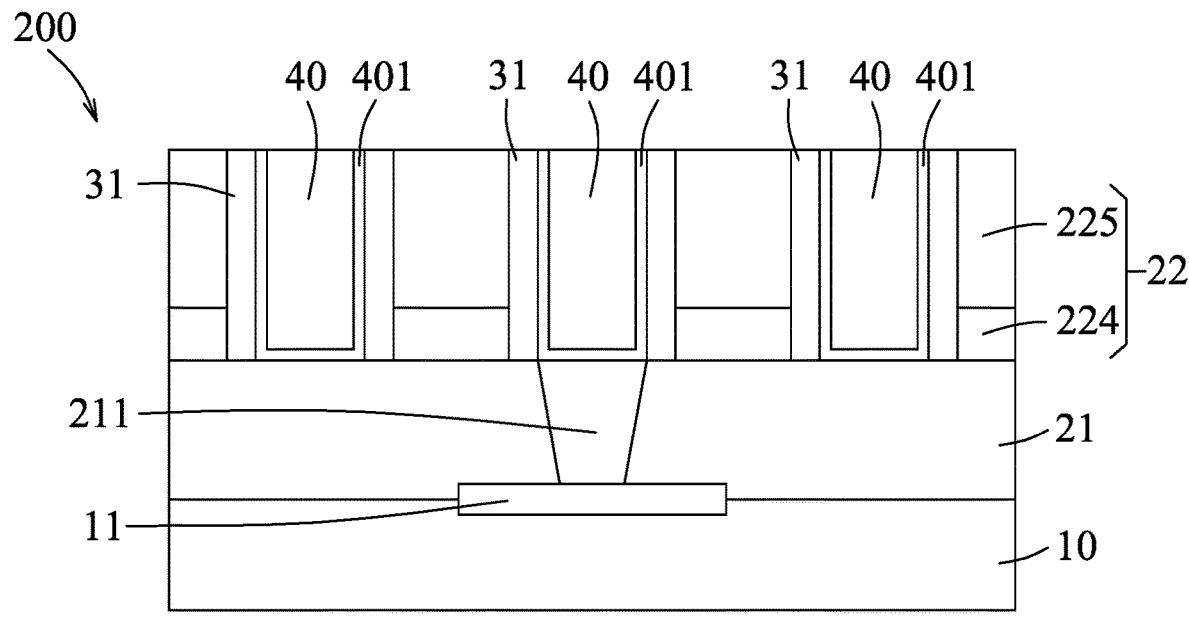
Figure 9:
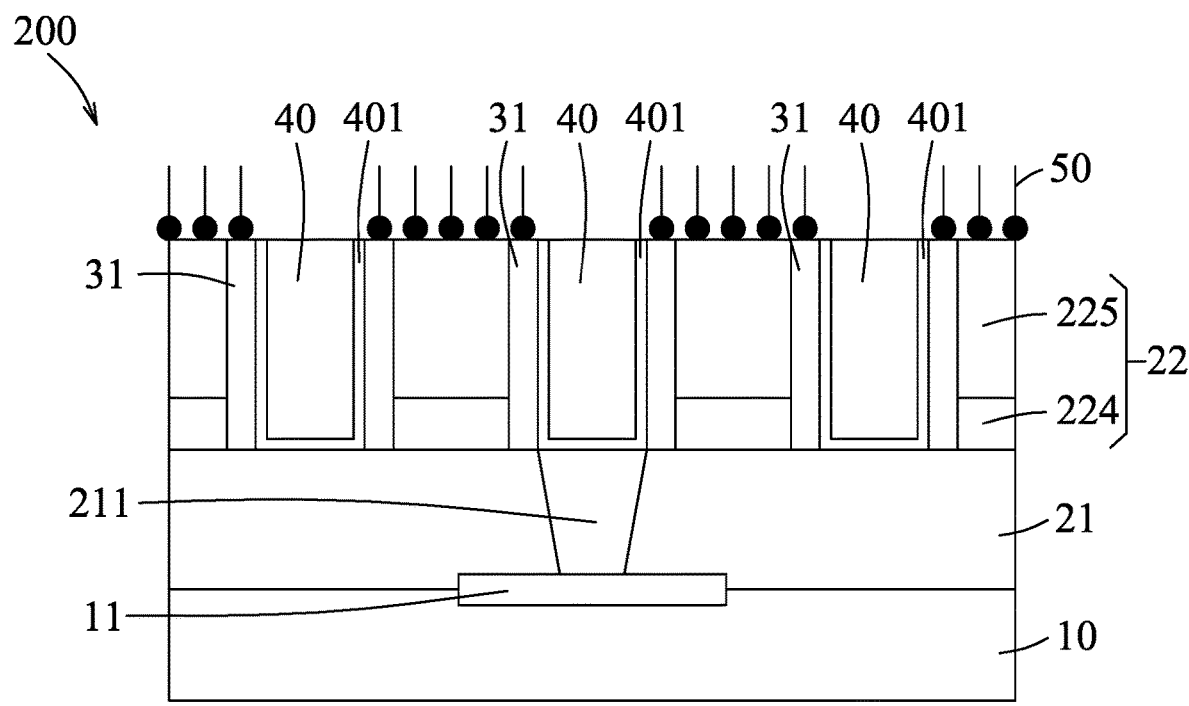
Figure 10:
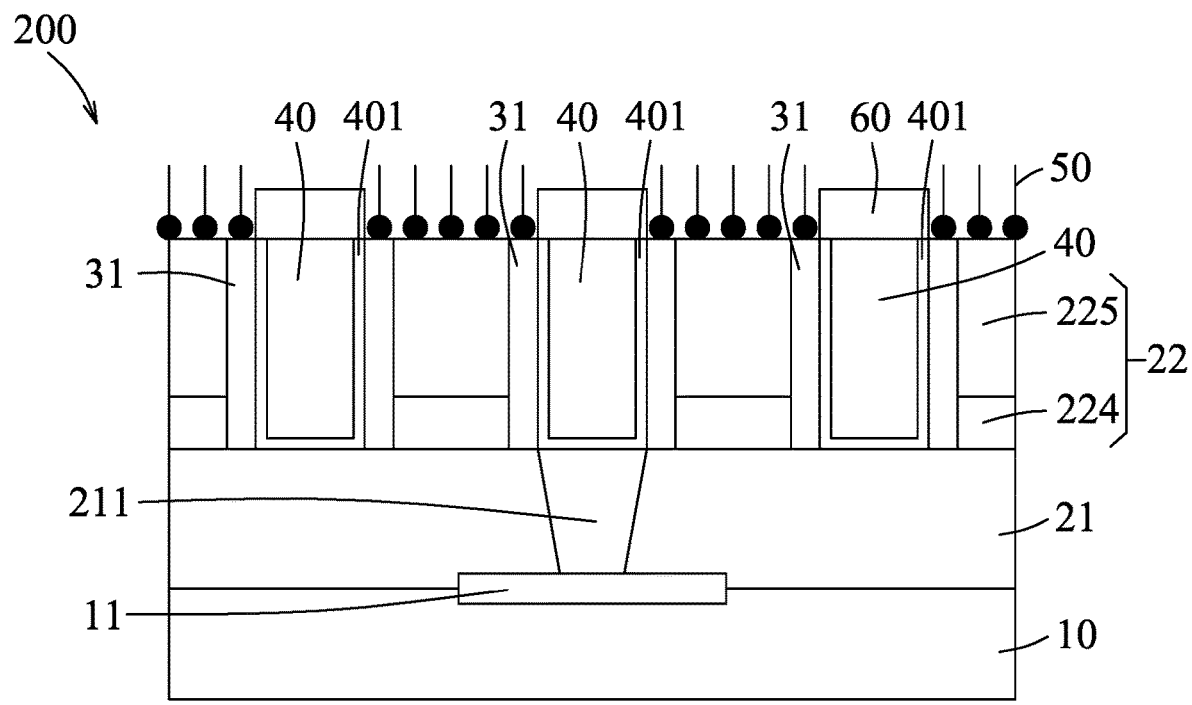
Figure 11:
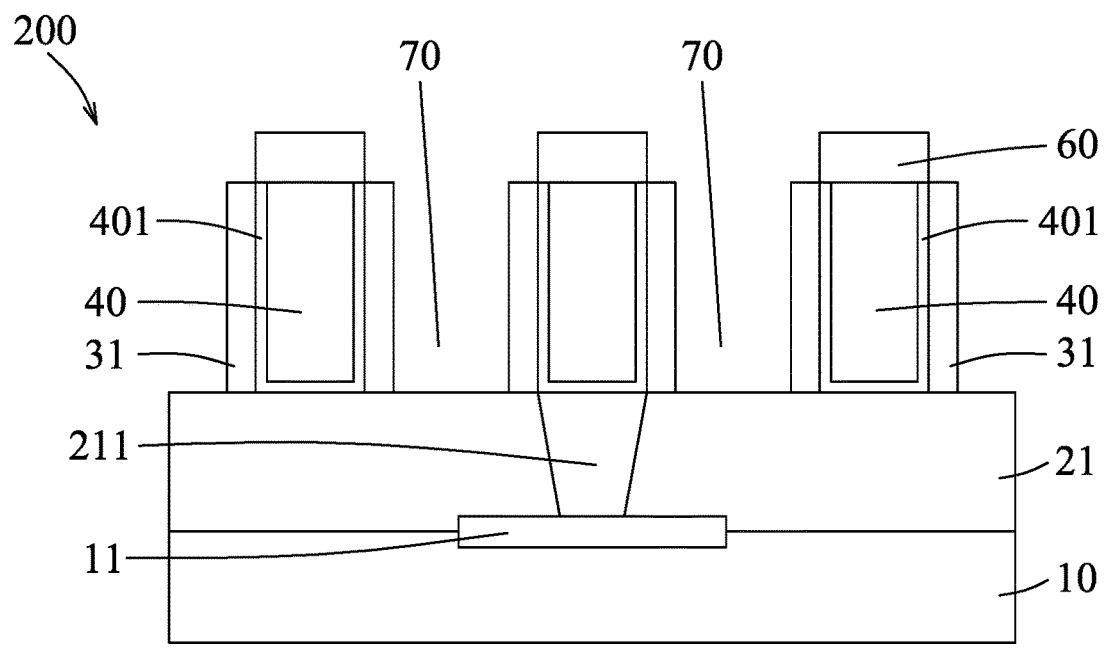
Figure 12:
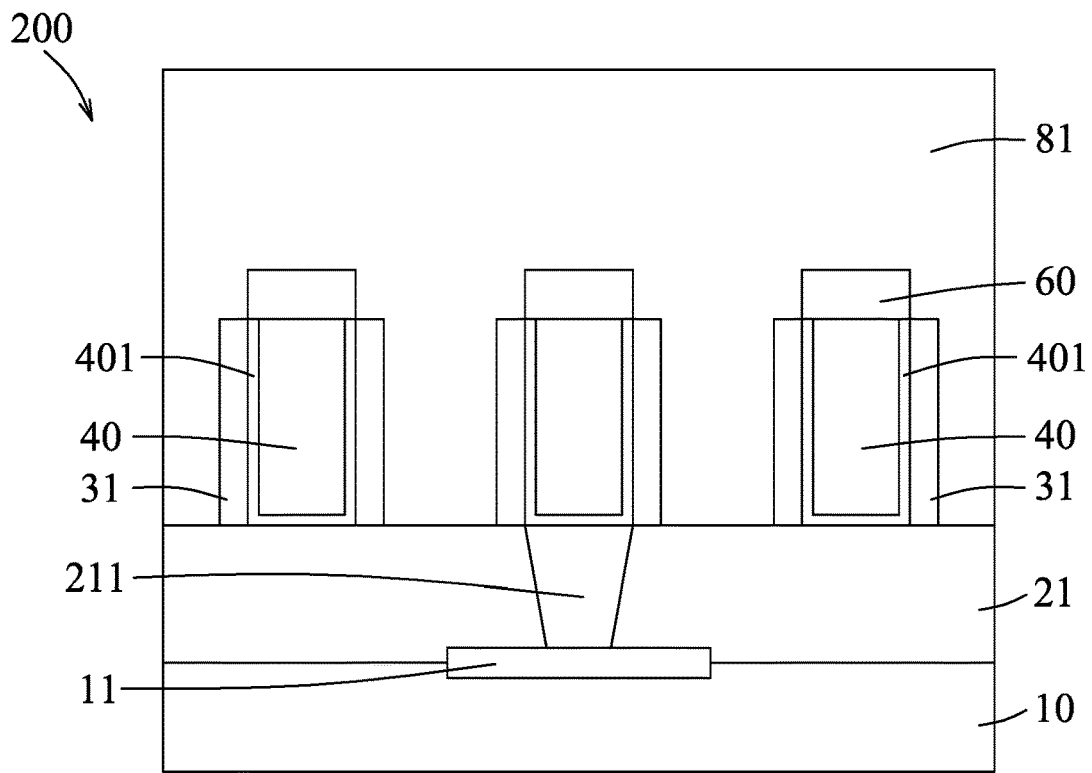
Figure 13:
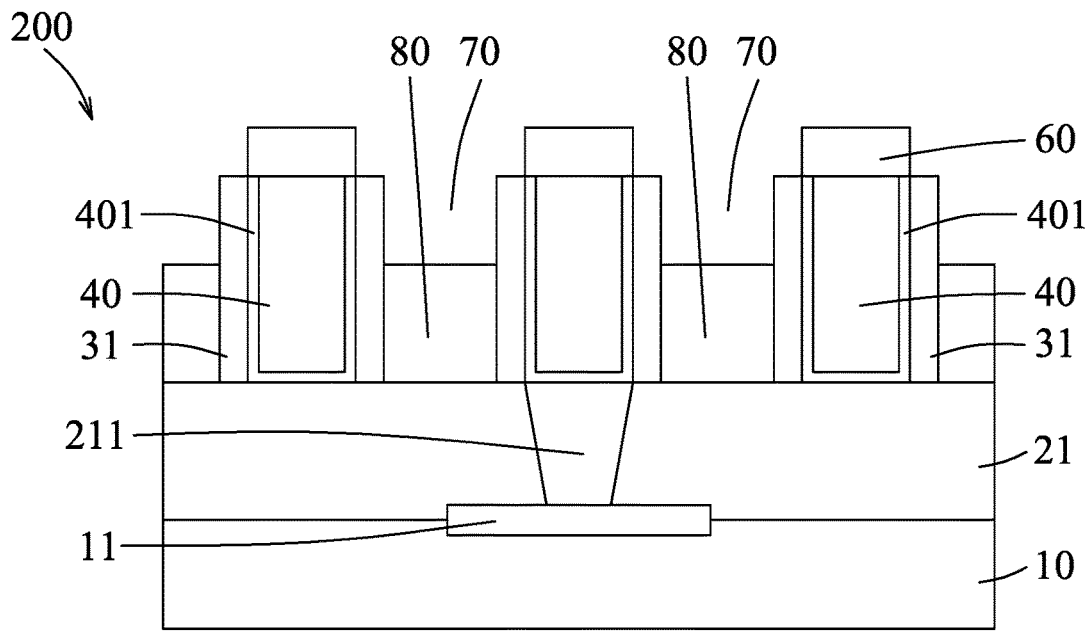
Figure 14:
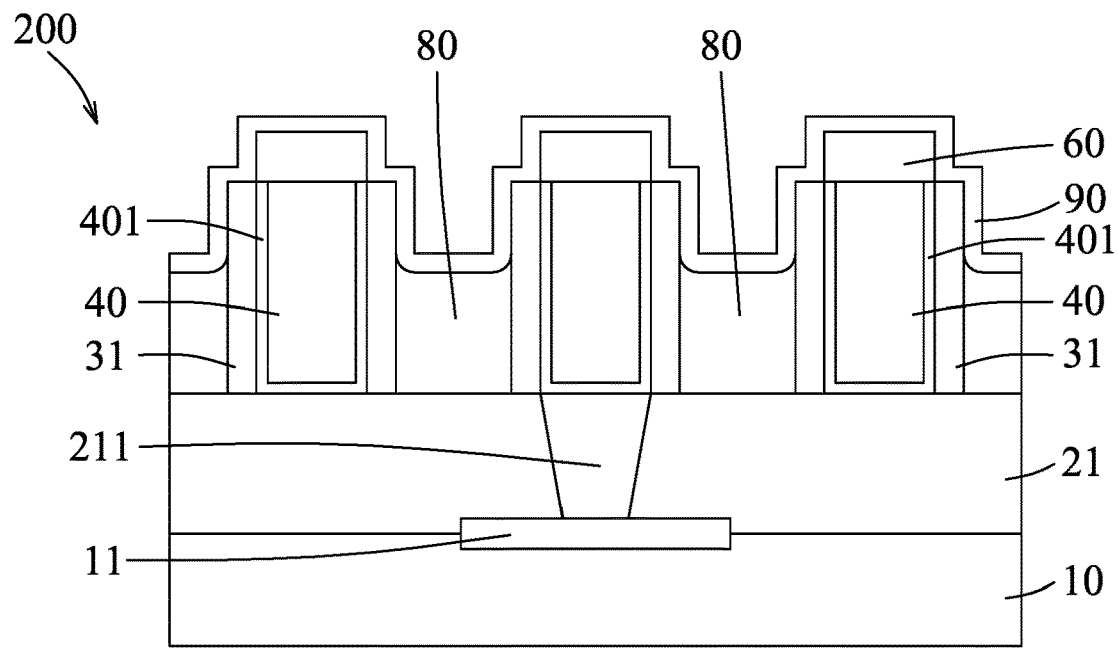

The method 100 then proceeds to block 106 where a plurality of spacer layers are formed. Referring to the example illustrated in FIG. 6, the patterned laminate 20 formed with the deposition layer 30 as shown in FIG. 5 is subjected to anisotropic etching to etch away the horizontal portions of the deposition layer 30 so as to form a plurality of spacer layers 31 on the lateral surfaces of the dielectric structure 22. The anisotropic etching may be implemented by a suitable anisotropic etching treatment as is known in the art of semiconductor fabrication, such as dry vertical anisotropic etching, but not limited thereto.

The method 100 then proceeds to block 108 where an electrically conductive material is filled into the trenches to form electrically conductive features. Referring to the example illustrated in FIGS. 6 and 7, an electrically conductive material is filled into the trenches 227 and over the spacer layers 31 to form a plurality of electrically conductive features 40, such as electrically conductive lines.

The electrically conductive material may be, for example, copper (Cu), aluminum (Al), gold (Au), silver (Ag), tungsten (W), cobalt (Co), ruthenium (Ru), molybdenum (Mo), chromium (Cr), manganese (Mn), rhodium (Rh), iridum (Ir), nickel (Ni), palladium (Pd), platinum (Pt), or alloys thereof. The electrically conductive material may be provided as multiple layers having varying composition, and may be filled into the trenches 227 by a suitable process as is known in the art of semiconductor fabrication, such as electroless plating, electroplating, sputter deposition, or CVD, but not limited thereto.

While the electrically conductive material may be a suitable metal or alloy thereof as described above, the method of the present disclosure are particularly adapted to the use of copper (Cu). Electroless plating of copper generally includes forming a seed layer followed by autocatalytic copper deposition. Examples of the material for the seed layer include copper (Cu), nickel (Ni), gold (Au), silver (Ag), palladium (Pd), Iridium (Ir), nickel-palladium-gold (NiPdAu), and nickel-gold (NiAu), but not limited thereto. The seed layer can be formed by a suitable process as is known in the art of semiconductor fabrication, such as electroless deposition, sputtering, or chemical vapor deposition, but not limited thereto. Before filling copper or the like into the trenches 227, the trenches 227 may be lined with a barrier layer 401 that prevents electromigration. Examples of materials for the barrier layer 401 include ruthenium (Ru), manganese (Mn), cobalt (Co), and chromium (Cr), titanium nitride (TiN), titanium tungsten (TiW), tantalum (Ta), tantalum nitride (TaN), tungsten nitride (WN), and combinations thereof. The barrier layer 401 can be deposited by a suitable process, such as CVD.

The method 100 then proceeds to block 110 where the electrically conductive features is subjected to planarization. Referring to the example illustrated in FIGS. 7 and 8, the electrically conductive features 40 are subjected to planarization, such as CMP, to permit the patterned dielectric layer 225 of the dielectric structure 22 to be exposed and to have a top surface substantially horizontally flush with top surfaces of the electrically conductive features 40.

The method 100 then proceeds to block 112 where a blocking layer is selectively deposited on the spacer layers and the dielectric structure. Referring to the example illustrated in FIG. 9, a blocking layer 50 is selectively deposited on the spacer layers 31 and the dielectric structure 22, and specifically on the spacer layers 31 and the patterned dielectric layer 225 of the dielectric structure 22 in such a manner that the electrically conductive features 40 are exposed from the blocking layer 50.

The selective deposition of the blocking layer 50 on spacer layers 31 and the patterned dielectric layer 225 of the dielectric structure 22 may be implemented by a suitable deposition process as is known to those skilled in the art of semiconductor fabrication, for example, CVD, ALD, spin-on deposition, dipping deposition, radical reaction deposition, etc., or combinations thereof, but not limited thereto. The top surfaces of the spacer layers 31 and the patterned dielectric layer 225 may be optionally subjected to a plasma treatment to optimize the selective deposition of the blocking layer 50 thereon. The blocking layer 50 has a thickness ranging from 2 Å to 50 Å.

The blocking layer 50 is made of a compound selected from butyltriethoxysilane, cyclohexyltrimethoxysilane, cyclopentyltrimethoxysilane, dodecyltriethoxysilane, dodecyltrimethoxysilane, decyltriethoxysilane, dimethoxy (methyl)-n-octylsilane, triethoxyethylsilane, ethyltrimethoxysilane, hexyltrimethoxysilane, hexyltriethoxysilane, hexadecyltrimethoxysilane, hexadecyltriethoxysilane, triethoxymethylsilane, trimethoxy(methyl)silane, methoxy (dimethyl)octadecylsilane, methoxy(dimethyl)-n-octylsilane, octadecyltriethoxysilane, triethoxy-n-octylsilane, octadecyltrimethoxysilane, trimethoxy(propyl)silane, trimethoxy-n-octylsilane, triethoxy(propyl)silane, methane, ethane, propane, butane, pentane, hexane, heptane, octane, nonane, decane, undecane, dodecane, pentadecane, hexadecane, or combinations thereof. Such compounds have a head group which contains silicon (Si) or carbon (C) and which is used as an anchor to be selectively bonded to the top surfaces of the spacer layers 31 and the patterned dielectric layer 225.

The method 100 then proceeds to block 114 where a dielectric material is selectively deposited on the exposed electrically conductive features. Referring to the example illustrated in FIG. 10, a dielectric material is selectively deposited on the exposed electrically conductive features 40 to form a capping layer 60 so as to permit the electrically conductive features 40 to be covered by the capping layer 60 and the spacer layers 31. Specifically, the blocking layer 50 is selectively deposited on the top surfaces of the spacer layers 31 and the patterned dielectric layer 225, and acts as an inhibitor to reduce the deposition rate of the dielectric material on the spacer layers 31 and the patterned dielectric layer 225 to be lower than the deposition rate of the dielectric material on the exposed electrically conductive features 40. Therefore, the dielectric material can be selectively deposited on the exposed electrically conductive features 40 to form the capping layer 60.

The dielectric material may be selectively deposited on the electrically conductive features 40 by a suitable method as is known to those skilled in the art of semiconductor fabrication, such as ALD, CVD, etc., or combinations thereof, to form the capping layer 60. Examples of a material suitable for forming the capping layer 60 includes, for example, silicon oxide, silicon nitride, silicon carbide, silicon oxycarbide, silicon oxynitride, silicon carbonitride, silicon oxycarbonitride, aluminum oxide, hafnium oxide, zirconium oxide, scandium oxide, stannic oxide, titanium oxide, zinc oxide, yttrium oxide, and combinations thereof, but are not limited thereto. The capping layer 60 thus formed may have a thickness ranging from 5 Å to 50 Å.

The method 100 then proceeds to block 116 where a plurality of recesses are formed. Referring to the example illustrated in FIGS. 10 and 11, the blocking layer 50 and the dielectric structure 22 are removed to form a plurality of recesses 70 defined by the spacer layers 31. Specifically, the blocking layer 50, the patterned dielectric layer 225, and the patterned etch stop layer 224 are etched away by a suitable etching method as is known to those skilled in the art of semiconductor fabrication, such as an isotropic dry or wet etching method, so as to form the recesses 70 defined by the spacer layers 31.

The method 100 then proceeds to block 118 where a plurality of sacrificial features are formed. Referring to the example illustrated in FIGS. 12 and 13, a plurality of sacrificial features 80 are formed in the recesses 70 such that each of the sacrificial features 80 has a predetermined height which is less than a height of each of the electrically conductive features 40. Specifically, formation of the sacrificial features 80 may be implemented by filling a thermal degradable material 81 into the recesses 70 and subjecting the thermal degradable material 81 to, for example, anisotropic etching until the sacrificial features 80 each having the predetermined height are formed in the recesses 70. The thermal degradable material 81 may be filled into the recesses 70 by a suitable method as is known to those skilled in the art of semiconductor fabrication, such as ALD, CVD, molecular layer deposition (MLD), PECVD, PEALD, spin-on deposition, etc., or combinations thereof. The deposition thickness of the thermal degradable material 81 may range from 10 Å to 3000 Å.

In some embodiments, the thermal degradable material 81 is a polymer material composed of carbon, oxygen, nitrogen, and hydrogen. In some embodiments, the thermal degradable material 81 is a polymer material which is thermally decomposable at a temperature lower than 400° C. In some embodiments, the thermal degradable material 81 is a sacrificial polymer, examples which include polyurea, polylactic acid, polycaprolactone, poly(methyl methacrylate), poly(ethylene oxide), and combinations thereof, but are not limited thereto. The anisotropic etching may be a suitable anisotropic etching as is known to those skilled in the art of semiconductor fabrication, for example, anisotropic dry etching, but not limited thereto. The predetermined heights of the sacrificial features 80 may be controlled by, for example, adjusting the etching time period for the anisotropic etching. In some embodiments, a ratio of the predetermined height of each of the sacrificial features 80 to a height of each of the electrically conductive features 40 is controlled to range from 50% to 90%. In some embodiments, the predetermined heights of the sacrificial features 80 ranges from 10 Å to 1000 Å.

The method 100 then proceeds to block 120 wherein a sustaining layer is formed. Referring to the example illustrated in FIG. 14, a second low-k dielectric material is deposited on the capping layer 60, the spacer layers 31, and the sacrificial features 80 by a low temperature deposition process to form a sustaining layer 90 which is porous and which covers the sacrificial features 80. The deposition for forming the sustaining layer 90 may be implemented by a suitable deposition process as is known to those skilled in the art of semiconductor fabrication, for example, PVD, CVD, ALD, PECVD, PEALD, etc., or combinations thereof, but not limited thereto. For example, the deposition may be implemented by ALD at a temperature ranging from 50° C. to 400° C. The second low-k dielectric material suitable for forming the sustaining layer 90 is a porous silicon-based material, examples of which include silicon oxide, silicon nitride, silicon carbide, silicon oxycarbide, silicon oxynitride, silicon carbonitride, silicon oxycarbonitride, and combinations thereof, but are not limited thereto. The sustaining layer 90 has a thickness ranging from 2 Å to 100 Å. When the thickness of the sustaining layer 90 is less than 2 Å, air gap structures formed thereafter may be collapsed. When the thickness of the sustaining layer 90 is greater than 100 Å, the sacrificial features 80 will not be removed efficiently.

The method 100 then proceeds to block 122 where the sacrificial features are removed. Referring to the example illustrated in FIGS. 14 and 15, the sacrificial features 80 are removed so as to obtain the semiconductor structure 200 having air gaps 91 which are confined by the sustaining layer 90, the spacer layers 31, and the interconnect layer 21. In some embodiments in accordance with the present disclosure, the sacrificial features 80 may be removed by a thermal treatment, an ultraviolet treatment, or a combination thereof. In some embodiments, the sacrificial features 80 may be removed by a thermal treatment at a temperature ranging from 300° C. to 400° C. for a time period ranging from 10 seconds to 10 minutes to permit the sacrificial features 80 to vaporize and to degas through the sustaining layer 90. When the temperature for the thermal treatment is lower than 300° C., the sacrificial features 80 will not be removed efficiently. When the temperature for the thermal treatment is higher than 400° C., it will be incompatible in a back end of line (BEOL) process. In addition, when the time period for the thermal treatment is less than 10 seconds, the sacrificial features 80 will not be removed efficiently. When the time period for the thermal treatment is greater than 10 minutes, the integrity of the metal lines, such as electrically conductive features 40 may be impacted. In some embodiments, the sacrificial features 80 may be removed by an ultraviolet treatment at an ultraviolet exposure energy density ranging from 10 mJ/cm$^2$ to 100 mJ/cm$^2$ for a time period ranging from 10 seconds to 10 minutes. When the ultraviolet exposure energy density is less than 10 mJ/cm$^2$, the sacrificial features 80 will not be removed efficiently. When the ultraviolet exposure energy density is greater than 100 mJ/cm$^2$, the integrity of the metal lines, such as electrically conductive features 40 may be impacted. Each of the air gaps 91 thus formed in the semiconductor structure 200 has a height which is less than a height of each of the electrically conductive features 40. In certain embodiments, a ratio of the height of each of the air gaps 91 to a height of each of the electrically conductive features 40 ranges from 50% to 90%, and each of the air gaps 91 has a height ranging from 10 Å to 1000 Å.

Figure 15:
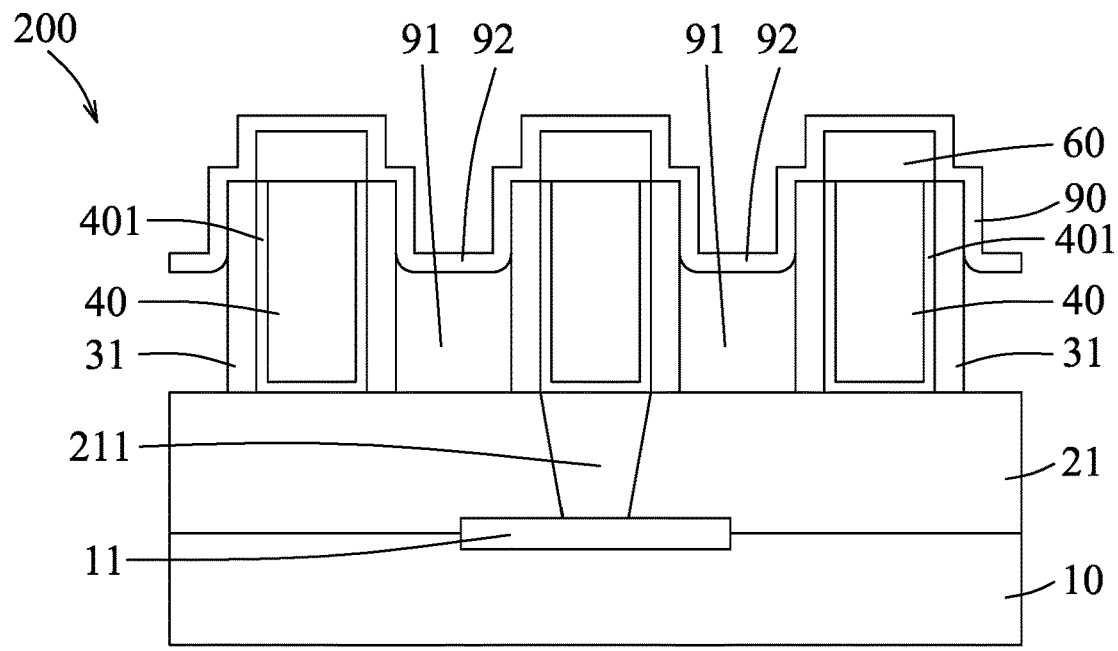

Referring to the example illustrated in FIG. 15, the semiconductor structure 200 in some embodiments includes the interconnect layer 21 disposed on the substrate 10, a plurality of the electrically conductive features 40, a plurality of the spacer layers 31, and the sustaining layer 90. The interconnect layer 21 includes the interconnect 211 (for example, electrically conductive via contact) which is electrically connected to the active region 11 of the substrate 10. The electrically conductive features 40 extend upwardly from the interconnect layer 21 and are spaced apart from each other. One of the electrically conductive features 40 is electrically connected to the interconnect 211. The spacer layers 31 extend upwardly from the interconnect layer 21 along the electrically conductive features 40 to laterally cover the electrically conductive features 40 so as to define a plurality of the air gaps 91. The sustaining layer 90 is disposed above the electrically conductive features 40 and covers the spacer layers 31 and the air gaps 91. The semiconductor structure 200 further includes the capping layer 60 which is disposed on the electrically conductive features 40 and is covered by the sustaining layer 90. The sustaining layer 90 provides good mechanical strength for preventing the air gaps 91 from damage. The sustaining layer 90 includes a plurality of protruding portions 92 extending downwardly to cap the air gaps 91, respectively, such that each of the air gaps 91 has a height which is less than a height of each of the electrically conductive features 40 and which ranges from 10 Å to 1000 Å. In certain embodiments, a ratio of the height of each of the air gaps 91 to a height of each of the electrically conductive features 40 ranges from 50% to 90%.

Figure 16:
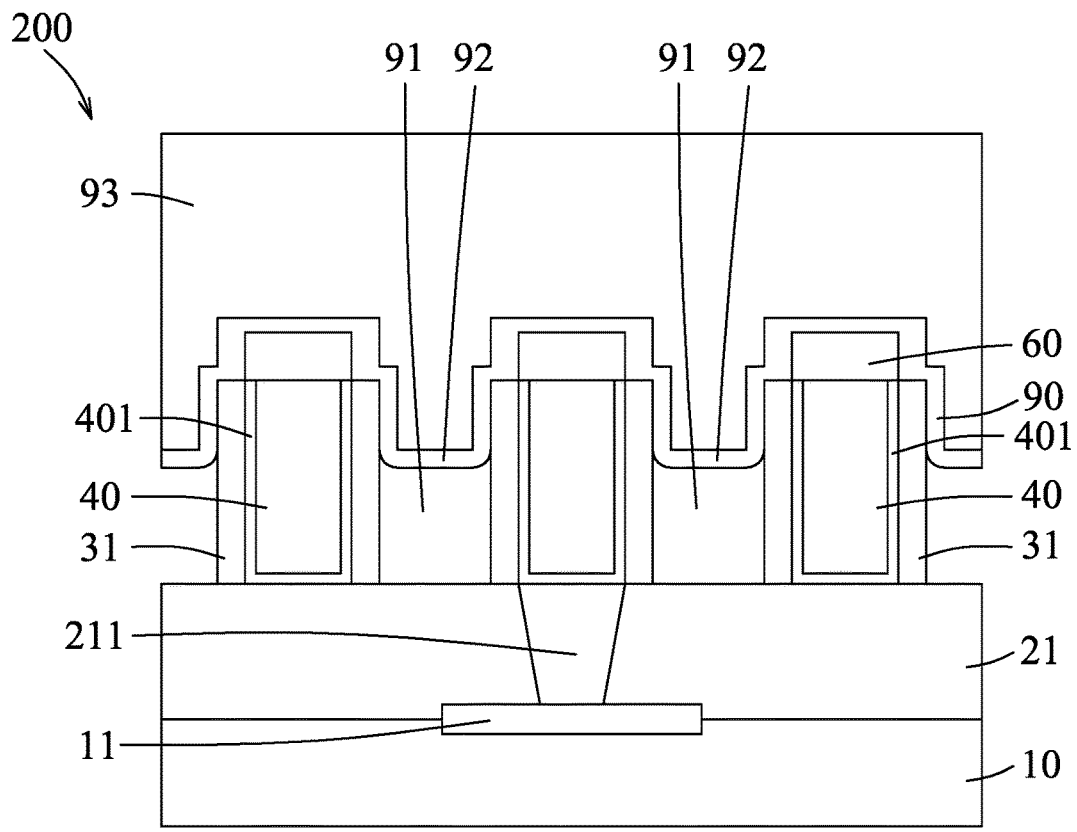
FIGS. 16 to 21 illustrate schematic views showing additional stages for further processing the semiconductor structure having air gaps manufactured in accordance with some embodiments.
Figure 17:
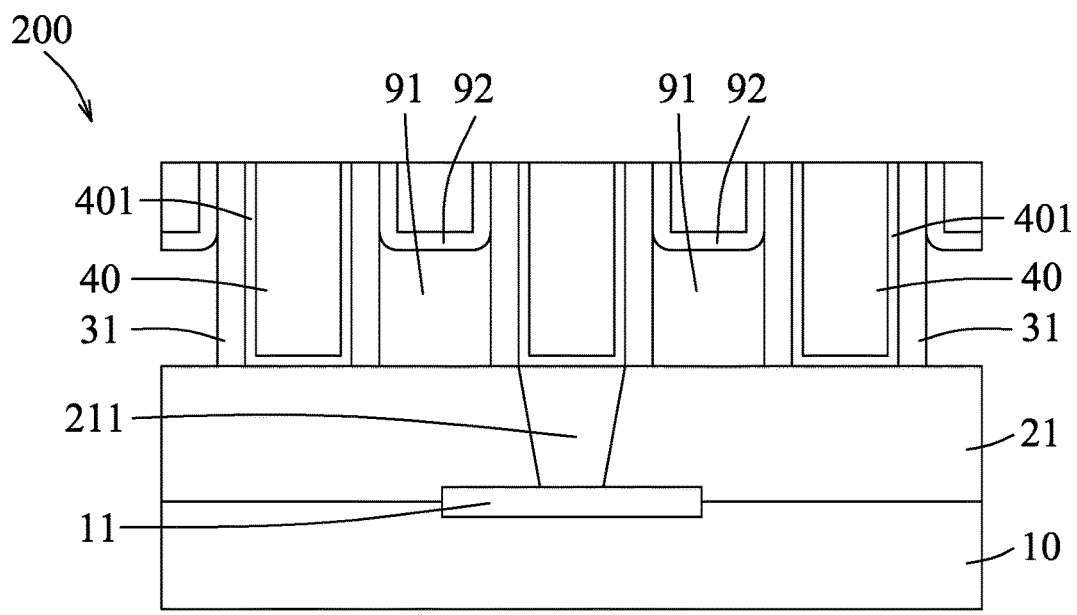

Referring to the example illustrated in FIGS. 16 and 17, a dielectric gap-filling material may be further deposited on the sustaining layer 90 by a suitable deposition method as is known to those skilled in the art of semiconductor fabrication, such as PVD, CVD, ALD, PECVD, PEALD, etc., or combinations thereof, to form a cap layer 93 having a substantially flat top surface and covering the sustaining layer 90. The cap layer 93 has a thickness ranging from 2 Å to 1000 Å. Examples of the dielectric gap-filling material include silicon oxide, silicon nitride, silicon carbide, silicon oxycarbide, silicon oxynitride, silicon carbonitride, silicon oxycarbonitride, other low-k dielectric material having a k-value ranging from about 2.0 to 3.6 (for example, SiCHO, a dielectric material containing silicon (Si), carbon (C), oxygen (O), and hydrogen (H) atoms), and combinations thereof, but are not limited thereto. The dielectric gap-filling material may have a porosity ranging from about 0.1% to 40%. Thereafter, the semiconductor structure 200 formed with the cap layer 93 may be subjected to a suitable planarization process as is known to those skilled in the art of semiconductor fabrication, such as CMP, to remove a portion of the cap layer 93, a portion of the sustaining layer 90, and the capping layer 60 to permit the semiconductor structure 200 to be formed with a substantially flat top surface with the different elements being substantially horizontally flush and to permit the electrically conductive features 40 to be exposed.

Figure 18:
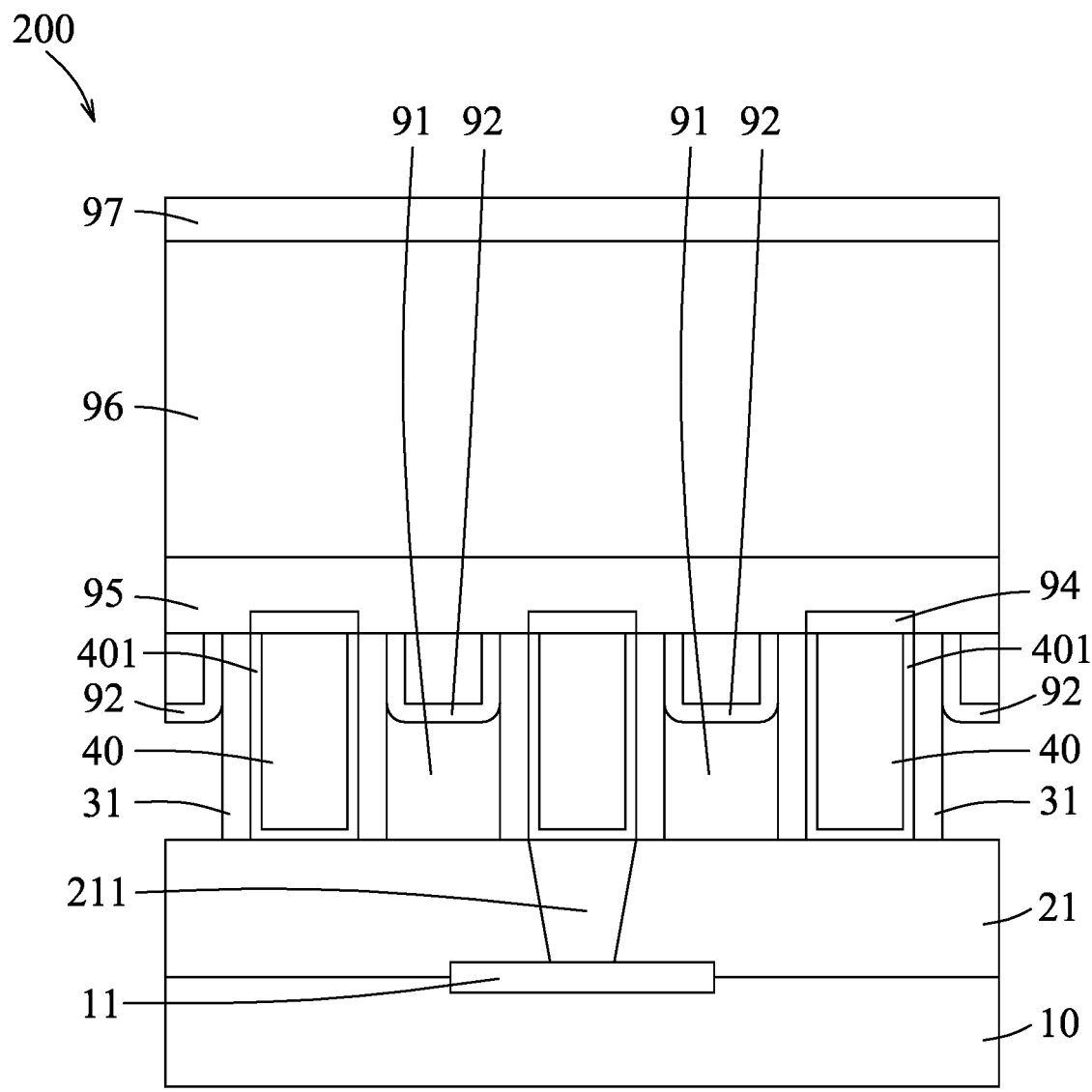

Referring to FIG. 18, a metal capping layer 94, such as a cobalt capping layer, may then be selectively deposited on the electrically conductive features 40 by a suitable selective deposition method, such as CVD, using an organometal compound, such as an organocobalt compound, as a precursor. Another etch stop layer 95, another dielectric layer 96, and another mask layer 97 are then deposited sequentially on the top surface of the semiconductor structure 200. The deposition of the another etch stop layer 95, the another dielectric layer 96, and the another mask layer 97 may be implemented by a suitable deposition process independently selected from PVD, CVD, PECVD, ALD, PEALD, etc., or combinations thereof, but not limited thereto.

The another etch stop layer 95 is used to provide good adhesion to the another etch stop layer 95. Materials suitable for forming the another etch stop layer 95 include, for example, aluminum compounds (for example, aluminum nitride, aluminum oxynitride, aluminum oxide, etc.), silicon compounds (for example, silicon oxycarbide, silicon carbonitride, silicon nitride, silicon oxycarbonitride, silicon oxide, silicon carbide, silicon oxynitride, etc.), other low-k dielectrics, and combinations thereof, but are not limited thereto. The another etch stop layer 95 may have a thickness ranging from 5 Å to 200 Å.

Materials suitable for forming the another dielectric layer 96 include, for example, silicon-based compounds, such as silicon oxide, silicon nitride, silicon carbide, silicon oxycarbide, silicon oxynitride, silicon carbonitride, silicon oxycarbonitride, and combinations thereof, but are not limited thereto.

Materials suitable for forming the another mask layer 97 include, for example, silicon oxide, silicon nitride, silicon carbide, silicon oxycarbide, silicon oxynitride, silicon carbonitride, silicon oxycarbonitride, cobalt, ruthenium, tungsten, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, and combinations thereof, but are not limited thereto.

Figure 19:
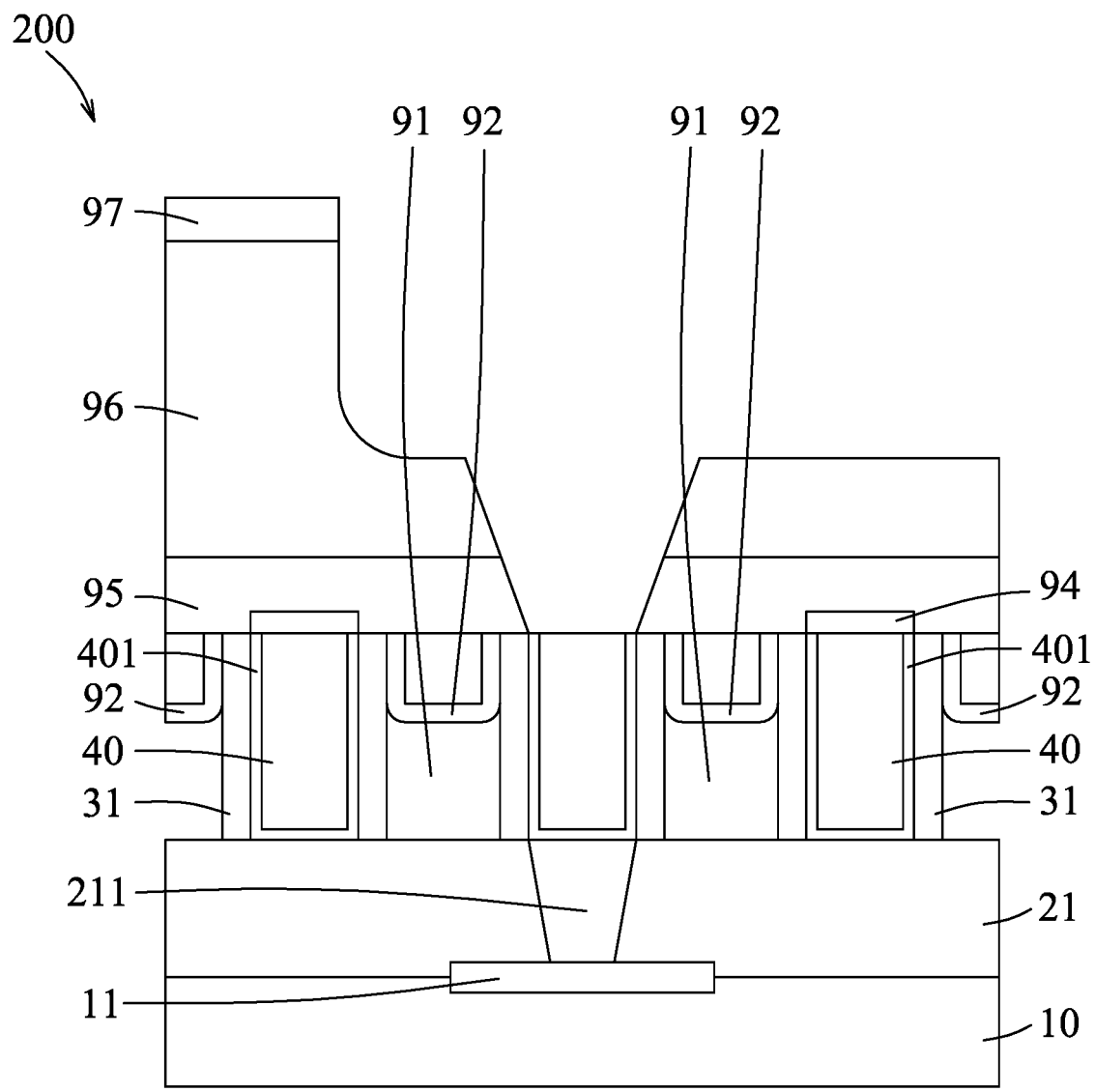

Referring to FIG. 19, the another mask layer 97 is patterned using photolithography and photoresist developing technology as is known to those skilled in the art of semiconductor fabrication. For example, the another mask layer 97 may be patterned by 193 nm immersion lithography or extreme ultraviolet (EUV) lithography. The another dielectric layer 96 and the another etch stop layer 95 are then etched sequentially by an etching treatment (for example, wet etching) through the pattern opening of the patterned another mask layer 97 to permit at least one of the electrically conductive features 40 to be exposed.

Figure 20:
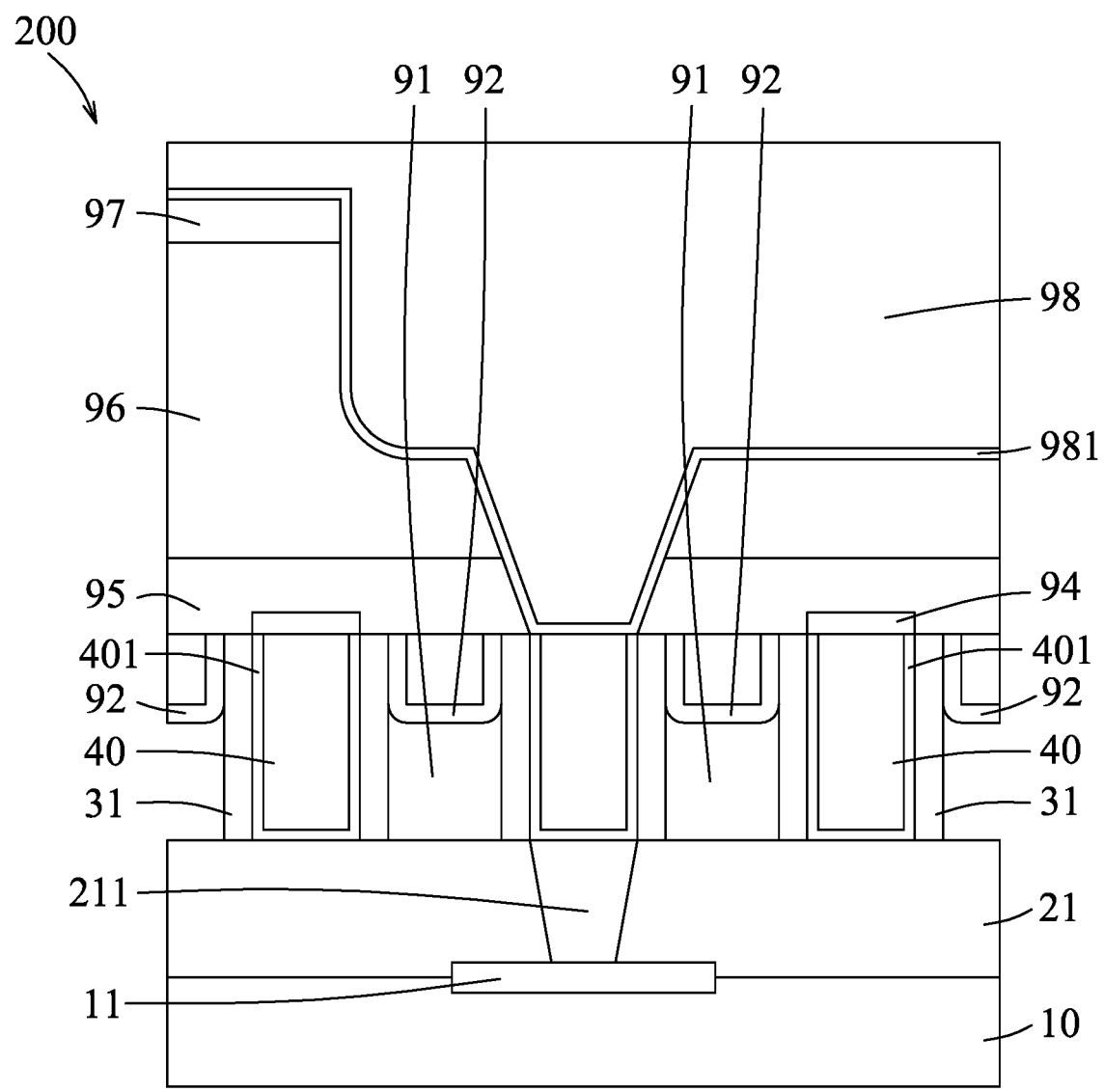

Referring to FIG. 20, at least one another electrically conductive feature 98 (for example, a via contact) is formed to be electrically connected to the at least one electrically conductive features 40. Details regarding the formation of the at least one another electrically conductive feature 98 are the same as or similar to those regarding the formation of the electrically conductive features 40 described above with reference to FIG. 7. In addition, similarly to that described above with reference to FIG. 7, before filling copper or the like into the recess of the another dielectric layer 96, the recess may be lined with a barrier layer 981 that prevents electromigration.

Figure 21:
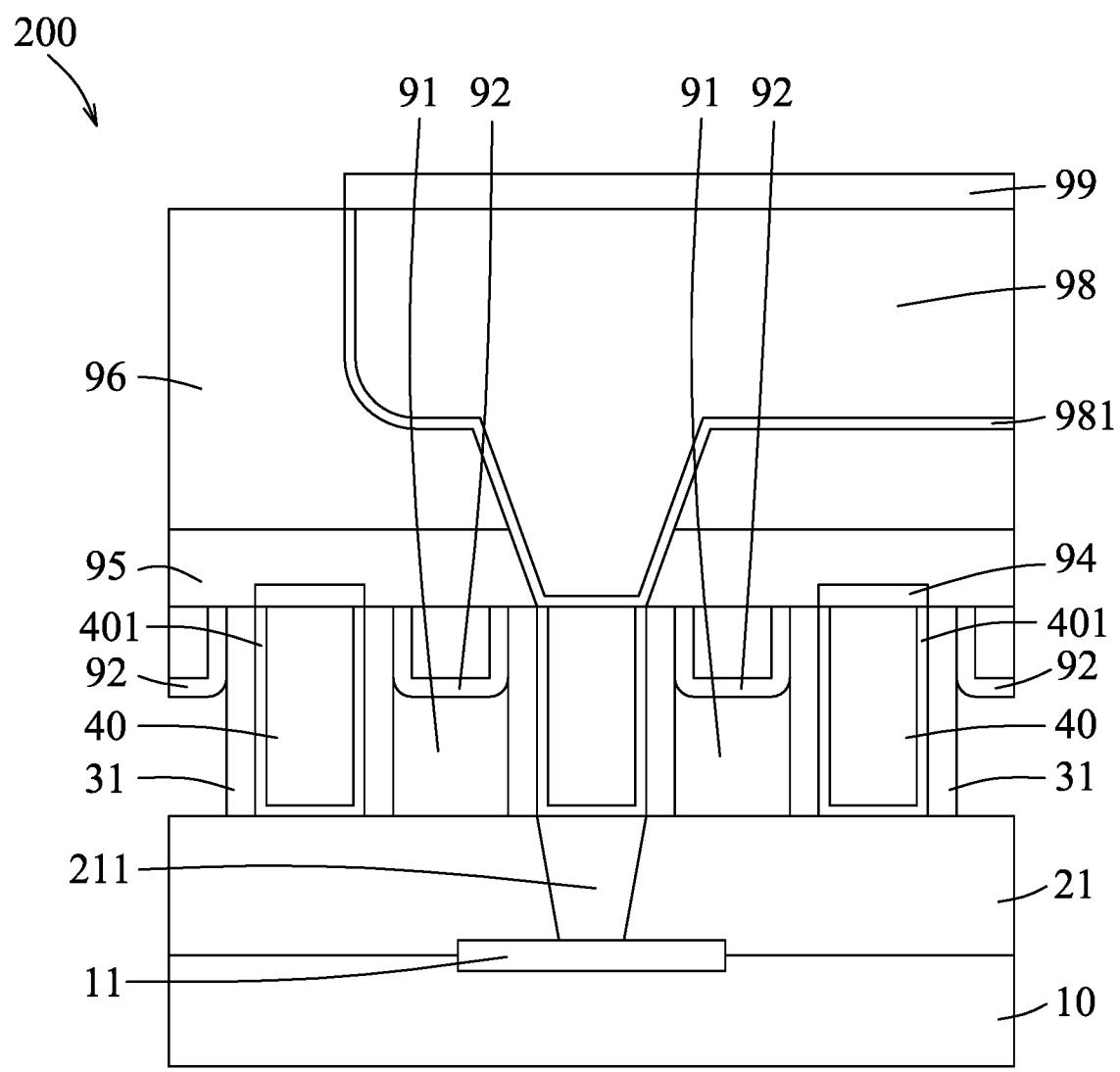

Referring to FIG. 21, the at least one another electrically conductive features 98 is subjected to planarization, such as CMP, to permit the another dielectric layer 96 to be exposed. Another metal capping layer 99, such as a cobalt capping layer, may then be selectively deposited on the at least one another electrically conductive features 98 by a suitable selective deposition method, such as CVD, using an organometal compound, such as an organocobalt compound, as a precursor.

Figure 22:
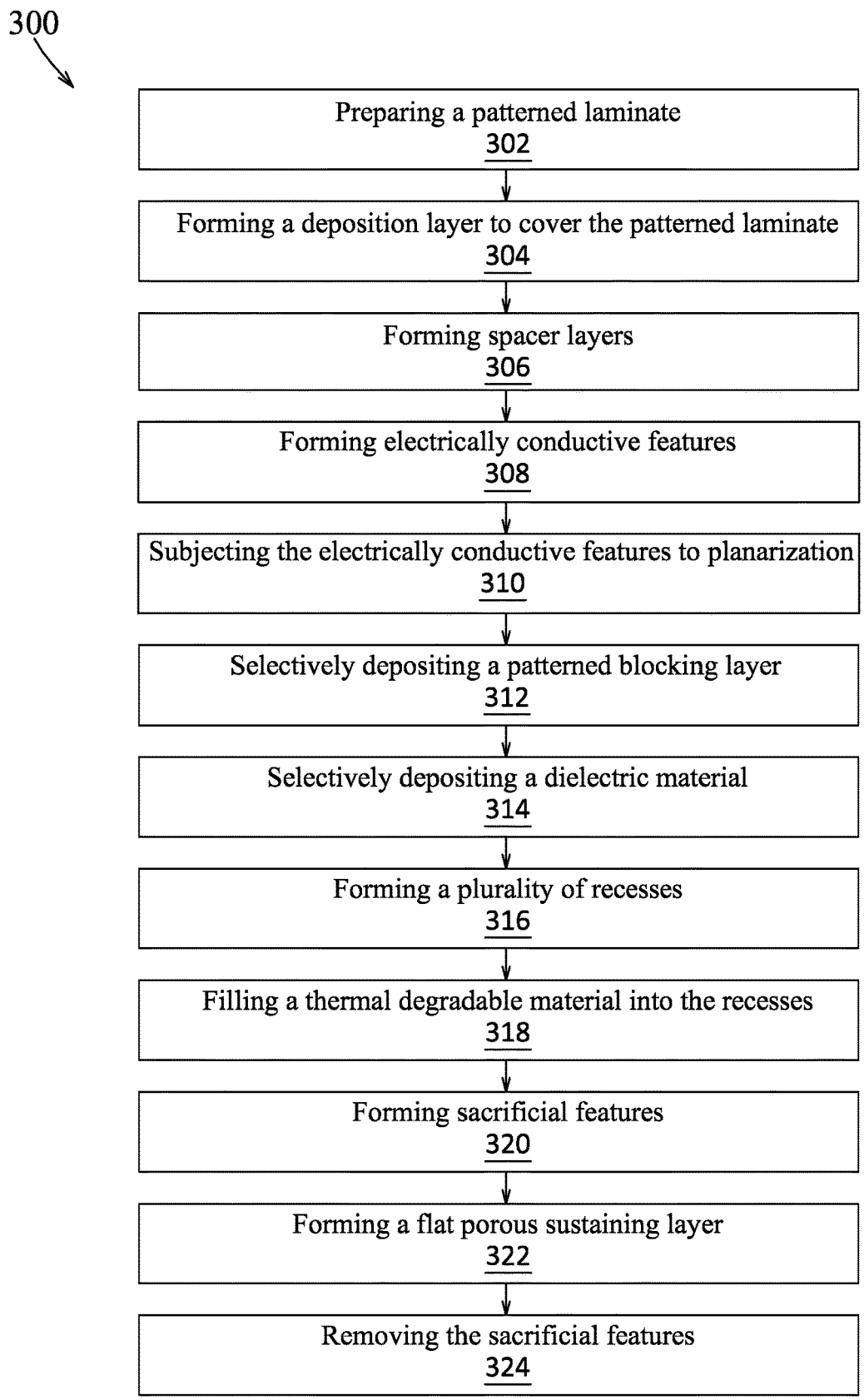
FIG. 22 is a flow diagram illustrating a method for manufacturing a semiconductor structure having air gaps in accordance with some embodiments.
Figure 23:
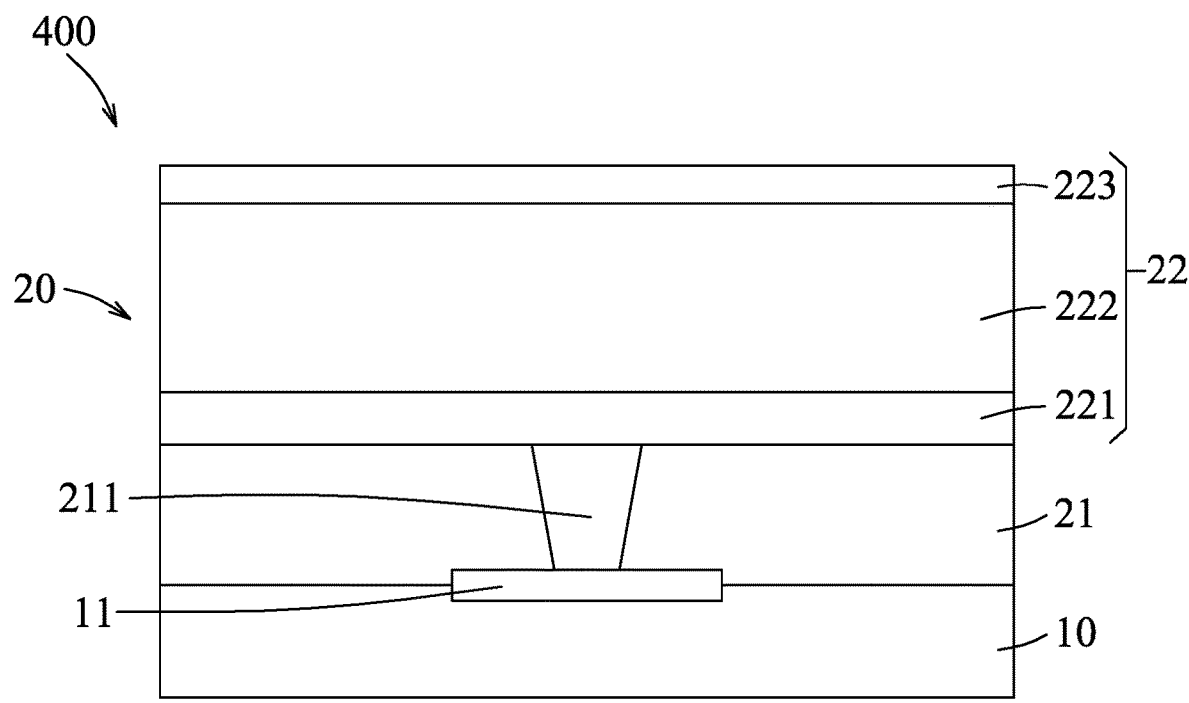
FIGS. 23 to 36 illustrate schematic views showing intermediate stages of the method for manufacturing a semiconductor structure having air gaps as depicted in FIG. 22.
Figure 24:
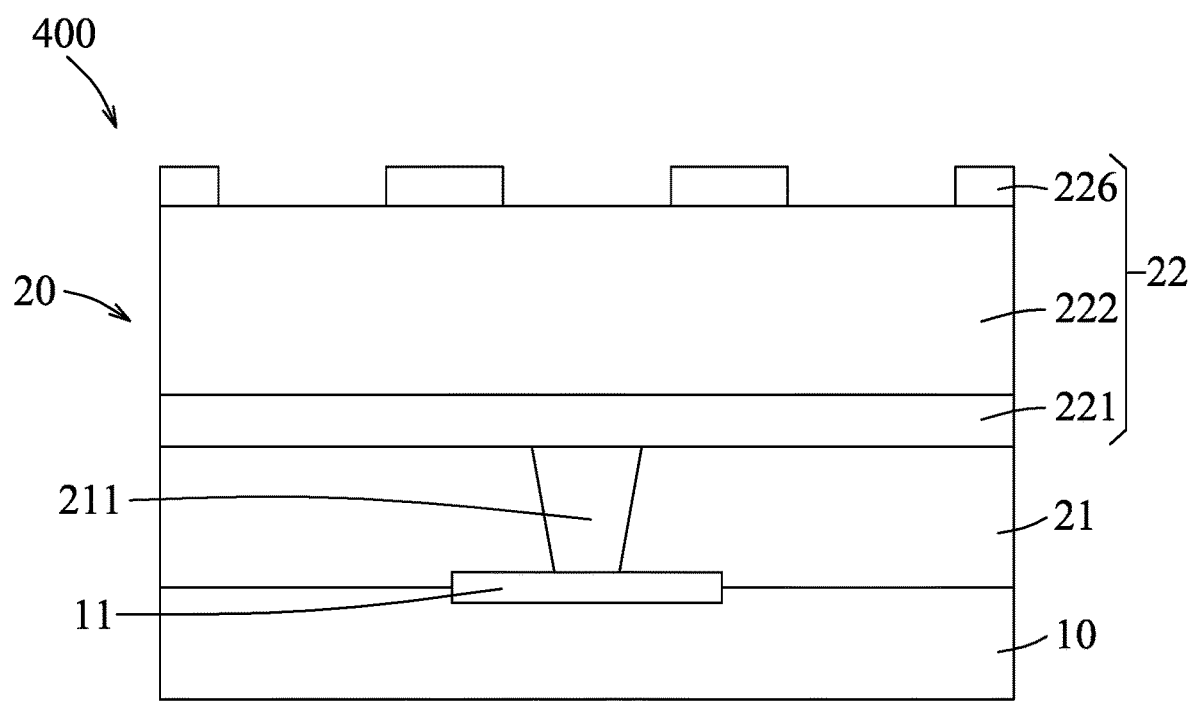
Figure 25:
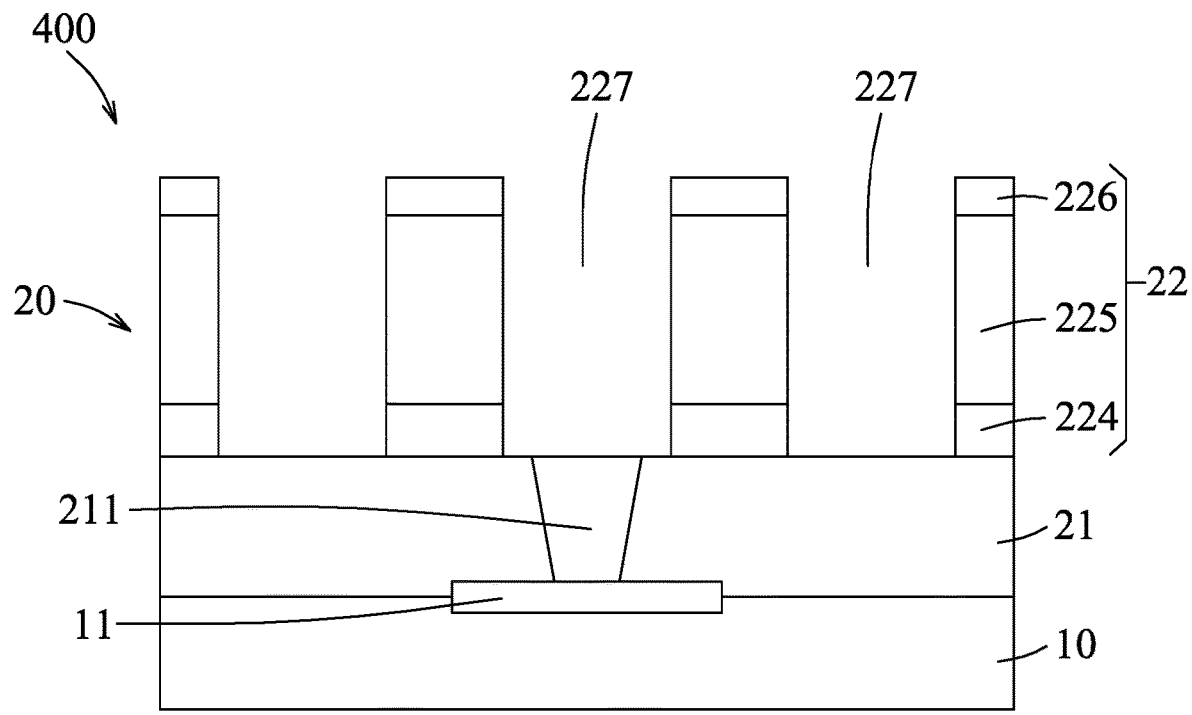

FIG. 22 illustrates a method 300 for manufacturing a semiconductor structure having air gaps in accordance with some embodiments. FIGS. 23 to 36 illustrate schematic views of a semiconductor structure 400 during various stages of the method depicted in FIG. 22. The method 300 and the semiconductor structure 400 are collectively described below. However, additional steps can be provided before, after or during the method 300, and some of the steps described herein may be replaced by other steps or be eliminated. Similarly, further additional features may be present in the semiconductor structure 400, and/or features present may be replaced or eliminated in additional embodiments.

Referring to FIG. 22, the method 300 begins at block 302, where a patterned laminate is prepared. Referring to the example illustrated in FIGS. 23 to 25, a patterned laminate 20 is prepared on a substrate 10. Details regarding the preparation of the patterned laminate 20 are the same as or similar those described above with reference to FIGS. 2 to 4.

The method 300 then proceeds to block 304 wherein a deposition layer is formed to cover the patterned laminate. Referring to the example illustrated in FIG. 26, the patterned laminate 20 is subjected to deposition of a first low-k dielectric material thereon to conformally form a deposition layer 30 (for example, a conformal deposition layer) covering the patterned laminate 20. Details regarding the conformal formation of the deposition layer 30 are the same as or similar to those described above with reference to FIG. 5.

Figure 26:
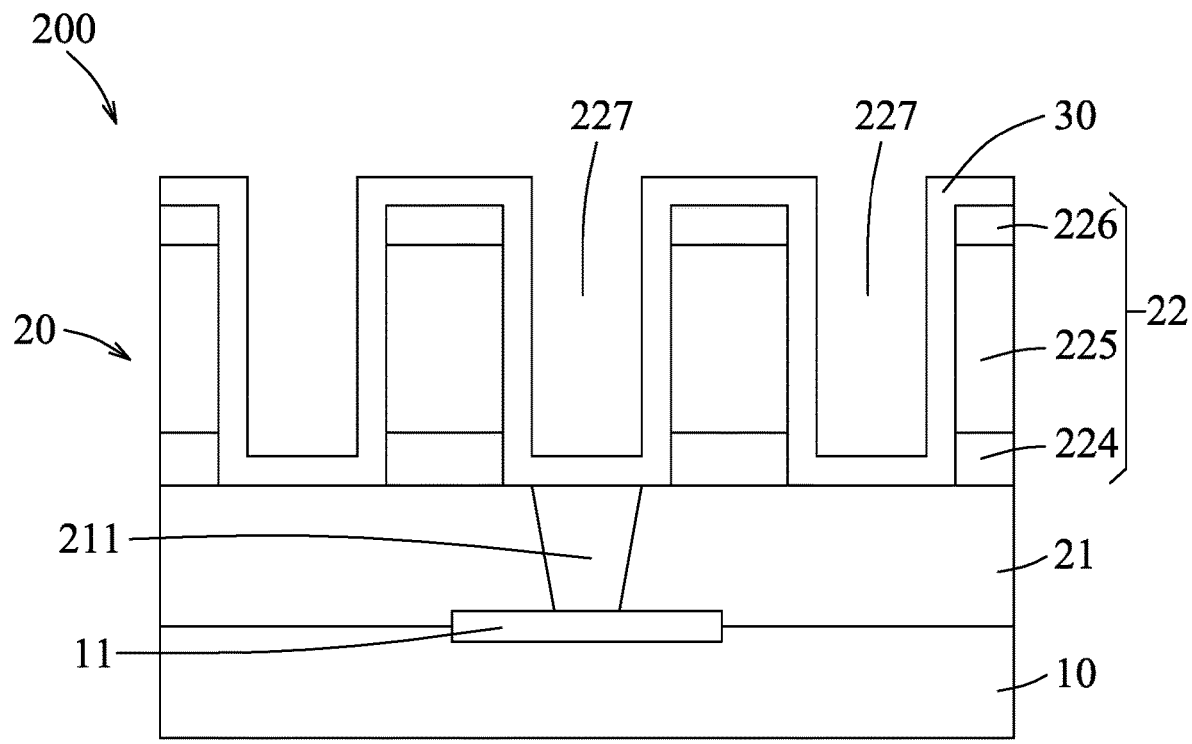
Figure 27:
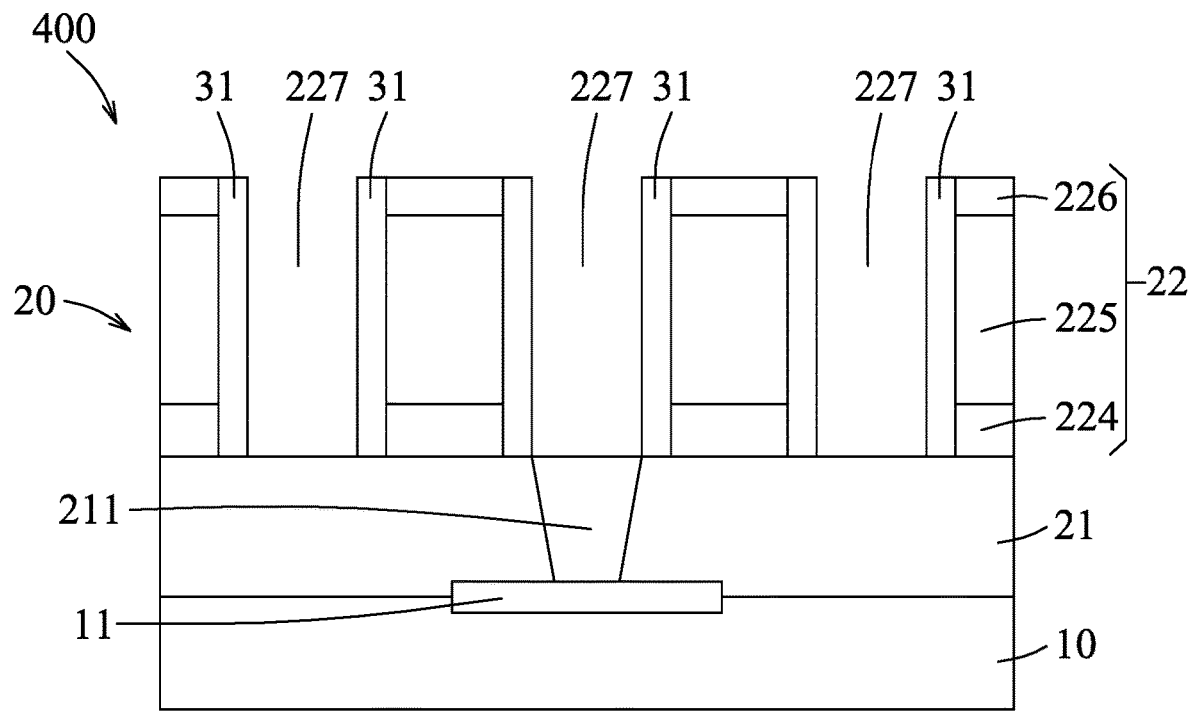
Figure 28:
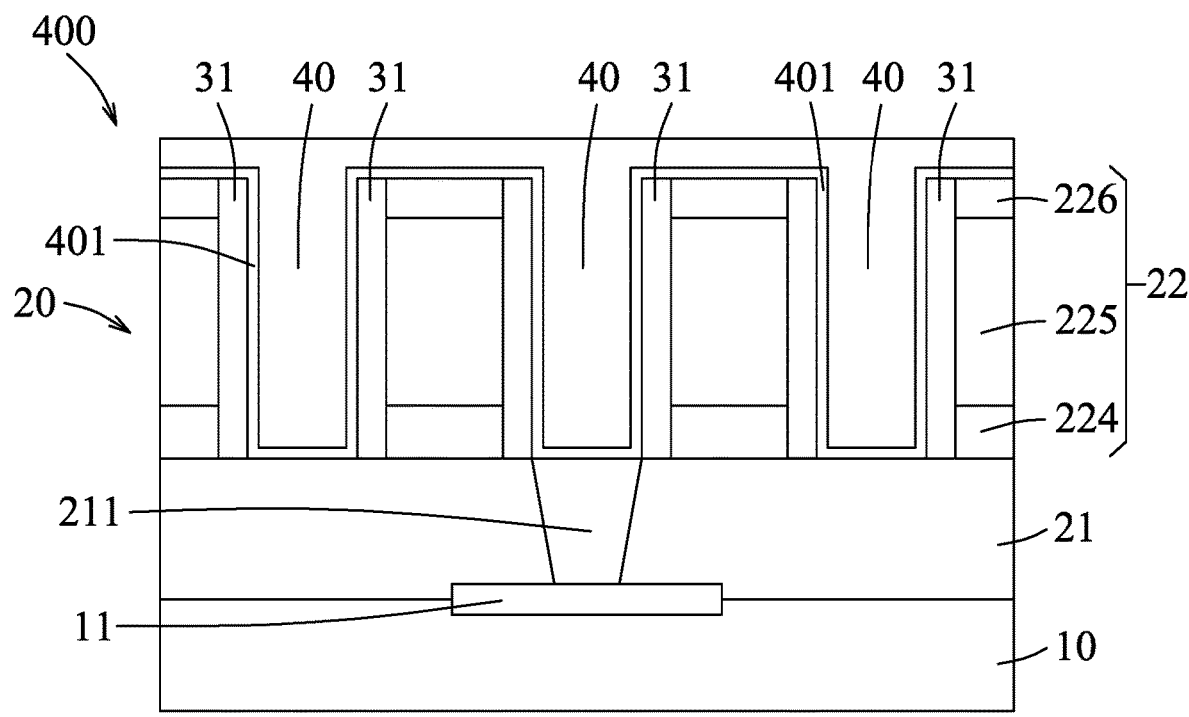
Figure 29:
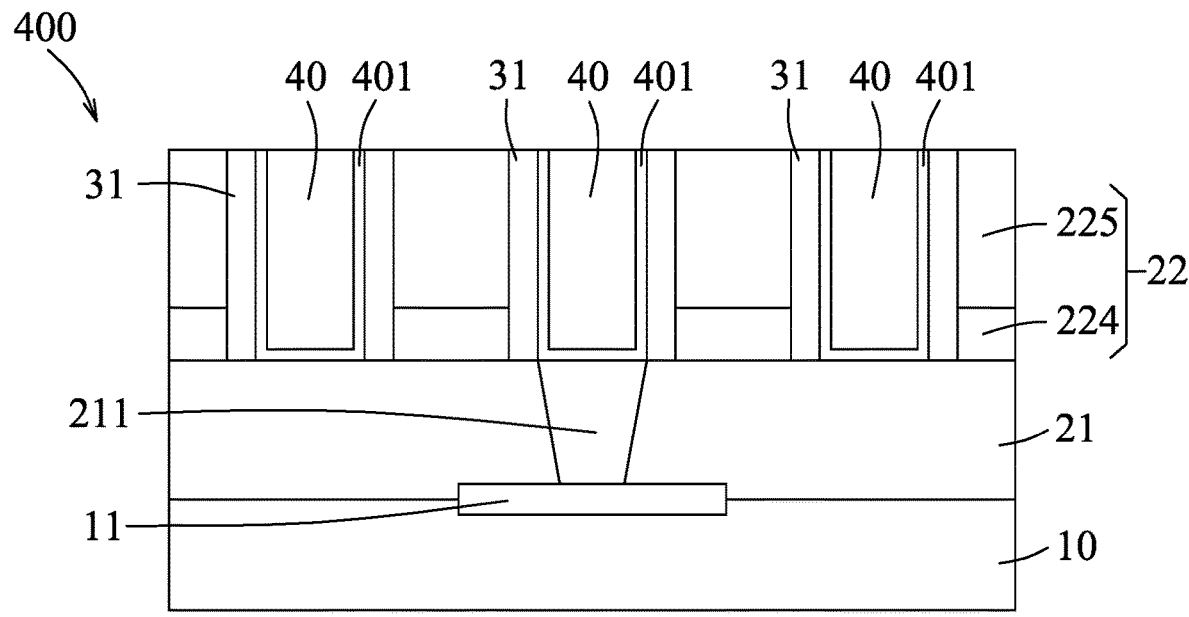
Figure 30:
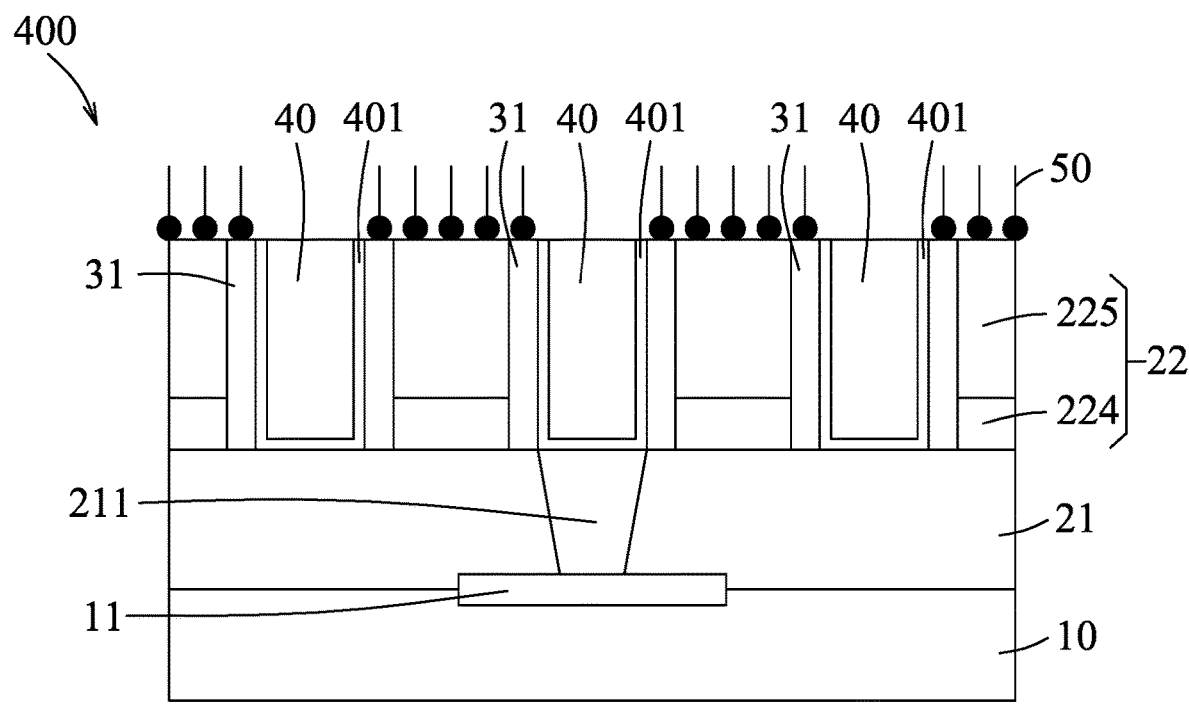
Figure 31:
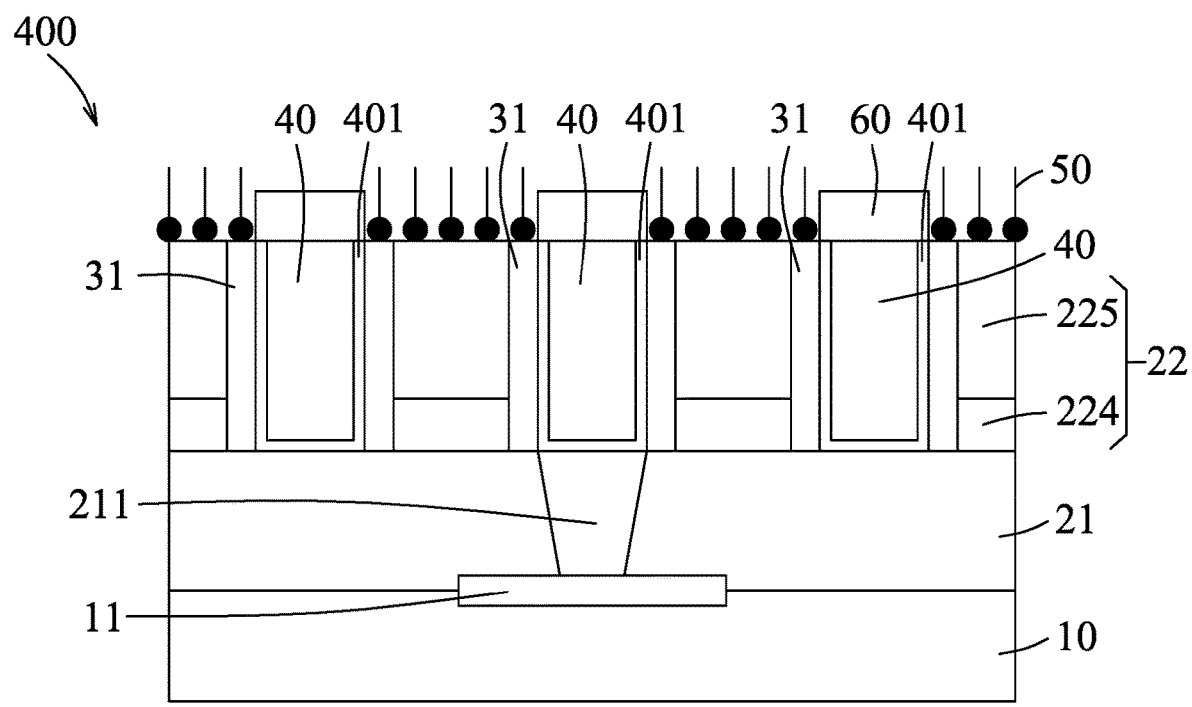
Figure 32:
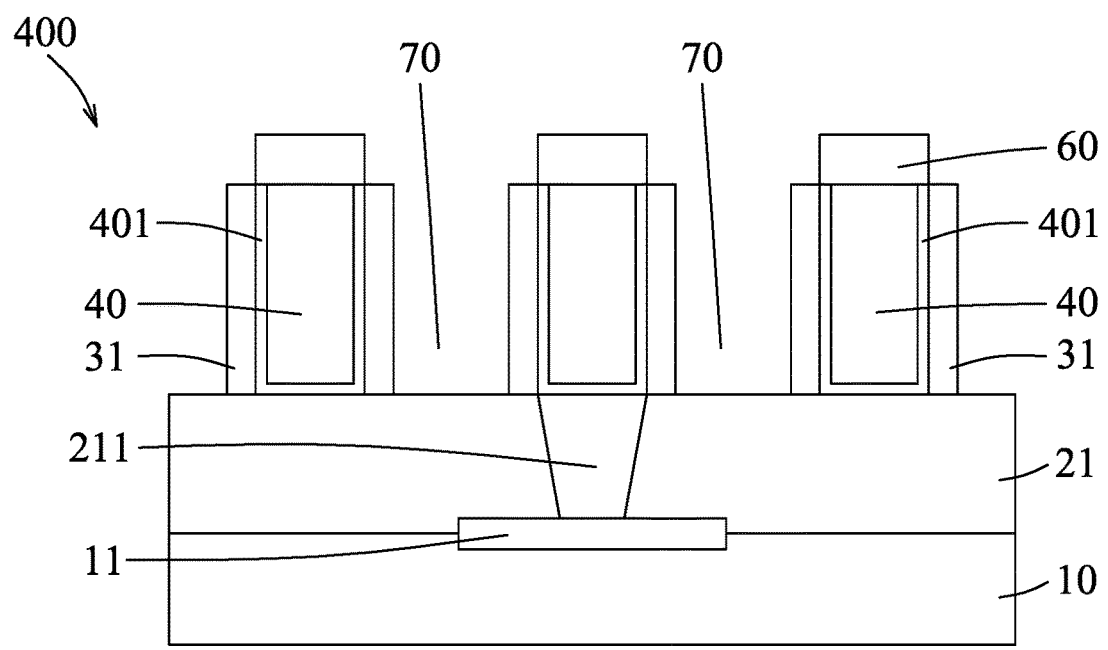
Figure 33:
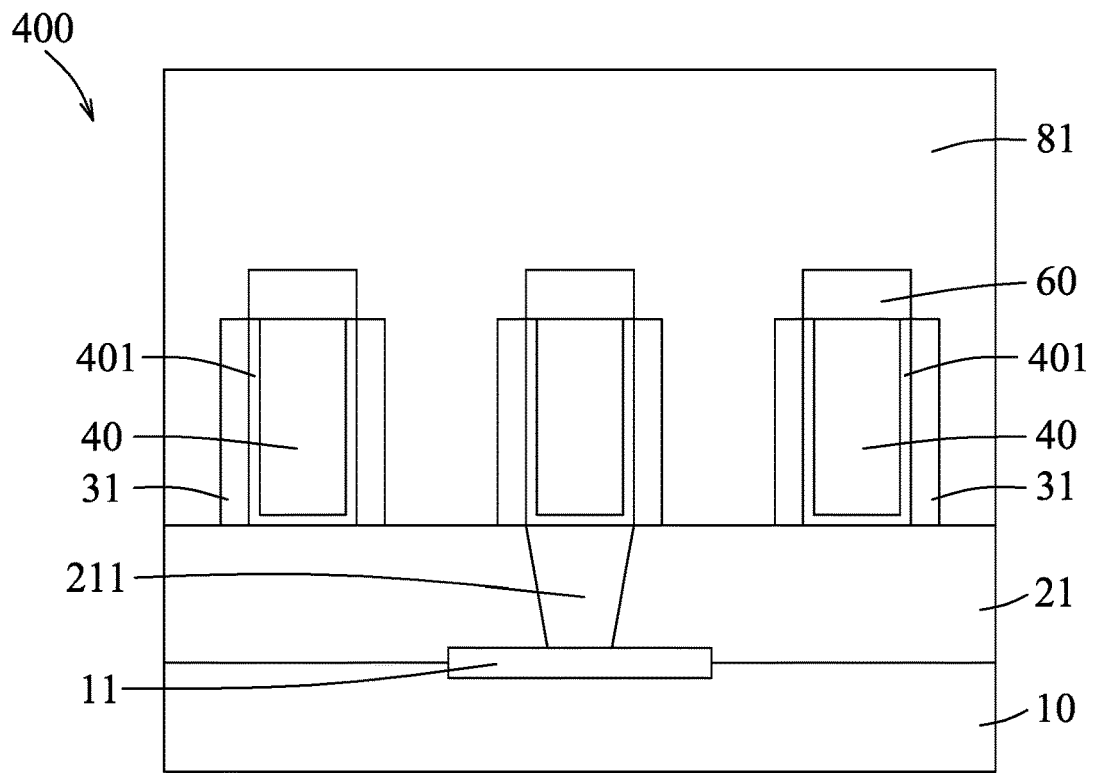
Figure 34:
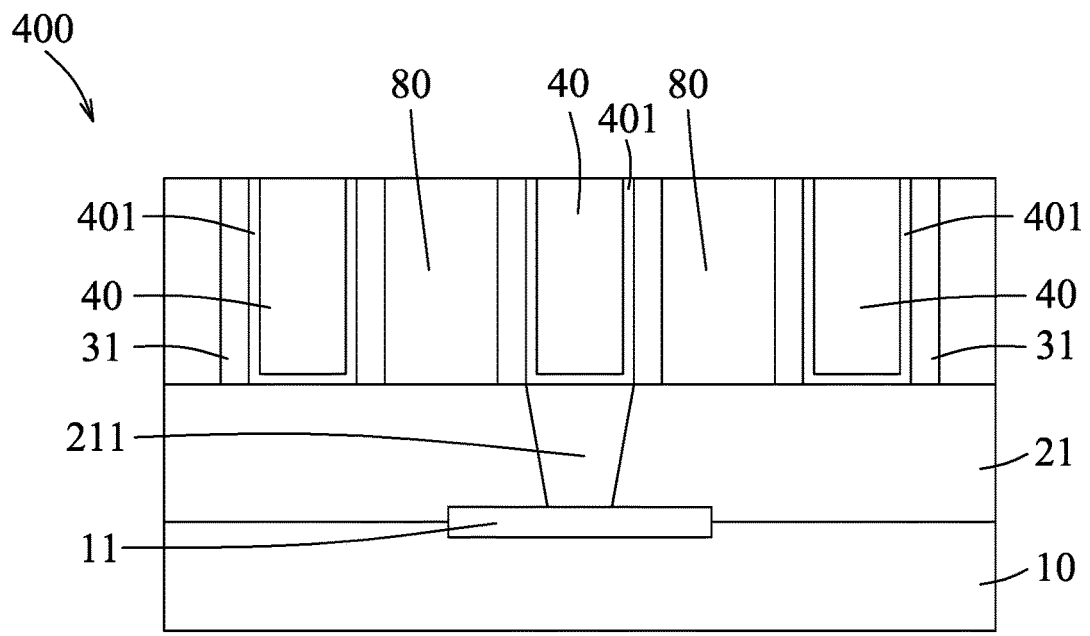
Figure 35:
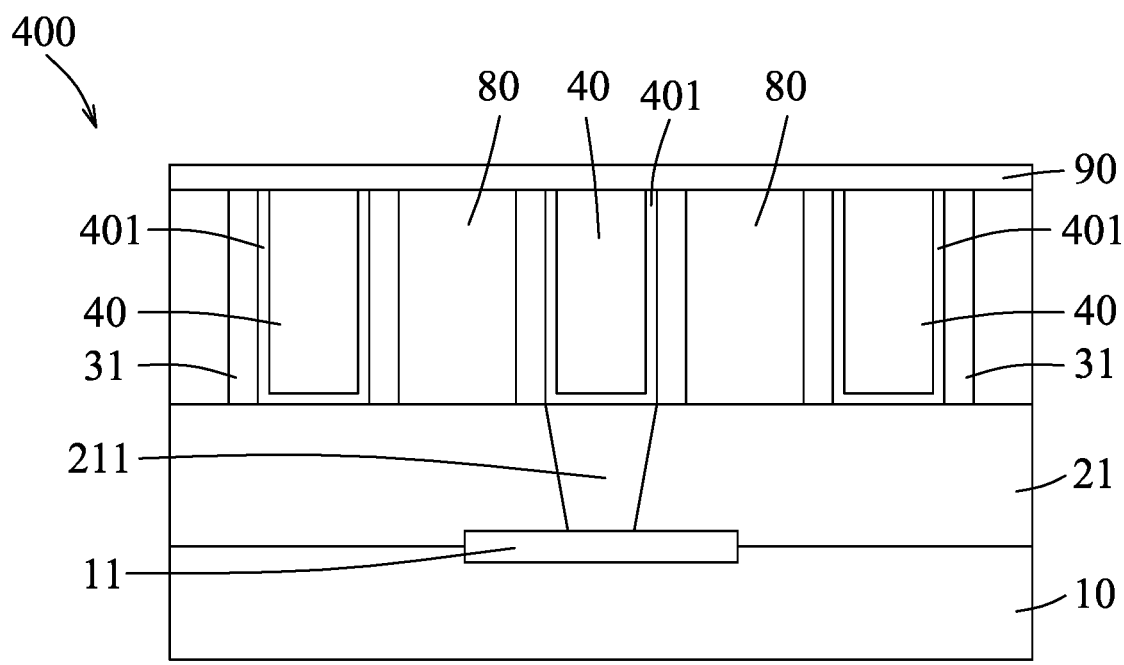

The method 300 then proceeds to block 306 where a plurality of spacer layers are formed. Referring to the example illustrated in FIG. 27, the patterned laminate 20 formed with the deposition layer 30 as shown in FIG. 26 is subjected to anisotropic etching to etch away the horizontal portions of the deposition layer 30 so as to form a plurality of spacer layers 31 on the lateral surfaces of the dielectric structure 22. Details regarding the formation of the spacer layers 31 are the same as or similar to those described above with reference to FIG. 6.

The method 300 then proceeds to block 308 where an electrically conductive material is filled into the trenches to form electrically conductive features. Referring to the example illustrated in FIGS. 27 and 28, an electrically conductive material is filled into the trenches 227 and over the spacer layers 31 to form a plurality of electrically conductive features 40, such as electrically conductive lines. Details regarding the formation of the electrically conductive features 40 are the same as or similar to those described above with reference to FIGS. 6 and 7.

The method 300 then proceeds to block 310 where the electrically conductive features is subjected to planarization. Referring to the example illustrated in FIGS. 28 and 29, the electrically conductive features 40 is subjected to planarization, such as CMP, to permit the patterned dielectric layer 225 of the dielectric structure 22 to be exposed and to have a top surface substantially horizontally flush with top surfaces of the electrically conductive features 40.

The method 300 then proceeds to block 312 where a blocking layer is selectively deposited on the spacer layers and the dielectric structure. Referring to the example illustrated in FIG. 30, a blocking layer 50 is selectively deposited on the spacer layers 31 and the dielectric structure 22 and specifically on the spacer layers 31 and the patterned dielectric layer 225 of the dielectric structure 22 in such a manner that the electrically conductive features 40 are exposed from the blocking layer 50. Details regarding the selective deposition of the blocking layer 50 are the same as or similar to those described above with reference to FIG. 9.

The method 300 then proceeds to block 314 where a dielectric material is selectively deposited on the exposed electrically conductive features. Referring to the example illustrated in FIG. 31, a dielectric material is selectively deposited on the exposed electrically conductive features 40 to form a capping layer 60 so as to permit the electrically conductive features 40 to be covered by the capping layer 60 and the spacer layers 31. Details regarding the formation of the capping layer 60 are the same as or similar to those described above with reference to FIG. 10.

The method 300 then proceeds to block 316 where a plurality of recesses are formed. Referring to the example illustrated in FIGS. 31 and 32, the blocking layer 50 and the dielectric structure 22 are removed to form a plurality of recesses 70 defined by the spacer layers 31. Details regarding the formation of the recesses 70 are the same as or similar to those described above with reference to FIGS. 10 and 11.

The method 300 then proceeds to block 318 where a thermal degradable material is filled into the recesses to form a cap layer. Referring to the example illustrated in FIGS. 32 and 33, a thermal degradable material 81 is filled into the recesses 70 and covers the capping layer 60 such that a cap layer 82 made of the thermal degradable material 81 is formed in the recesses 70 and on the capping layer 60 and the spacer layers 31. Details regarding the formation of the cap layer 82 are the same as or similar to those described above with reference to FIGS. 11 and 12.

The method 300 then proceeds to block 320 where sacrificial features are formed. Referring to the example illustrated in FIGS. 33 and 34, the capping layer 60 and the cap layer 82 are removed by a suitable planarization process as is known to those skilled in the art of semiconductor fabrication, for example, CMP, to form sacrificial features 80 which are made of the thermal degradable material and which have top surfaces substantially horizontally flush with those of the electrically conductive features 40 and the spacer layers 31.

The method 300 then proceeds to block 322 where a flat porous sustaining layer is formed. Referring to the example illustrated in FIG. 35, the top surfaces of the sacrificial features 80, the electrically conductive features 40, and the spacer layers 31 are subjected to deposition of a second low-k dielectric material by a low temperature deposition process to form a sustaining layer 90 that is flat and porous. Details regarding the formation of the sustaining layer 90 are the same as or similar to those described above with reference to FIG. 14.

The method 300 then proceeds to block 324 where the sacrificial features are removed. Referring to the example illustrated in FIGS. 35 and 36, the sacrificial features 80 are removed so as to obtain the semiconductor structure 400 having air gaps 91 which are confined by the sustaining layer 90, the spacer layers 31, and the interconnect layer 21. The process for removing the sacrificial features 80 is the same or similar to that described above with reference to FIGS. 14 and 15, and is not further described in details.

The air gaps 91 thus formed in the semiconductor structure 400 have heights which are the substantially same as those of the electrically conductive features 40.

Figure 36:
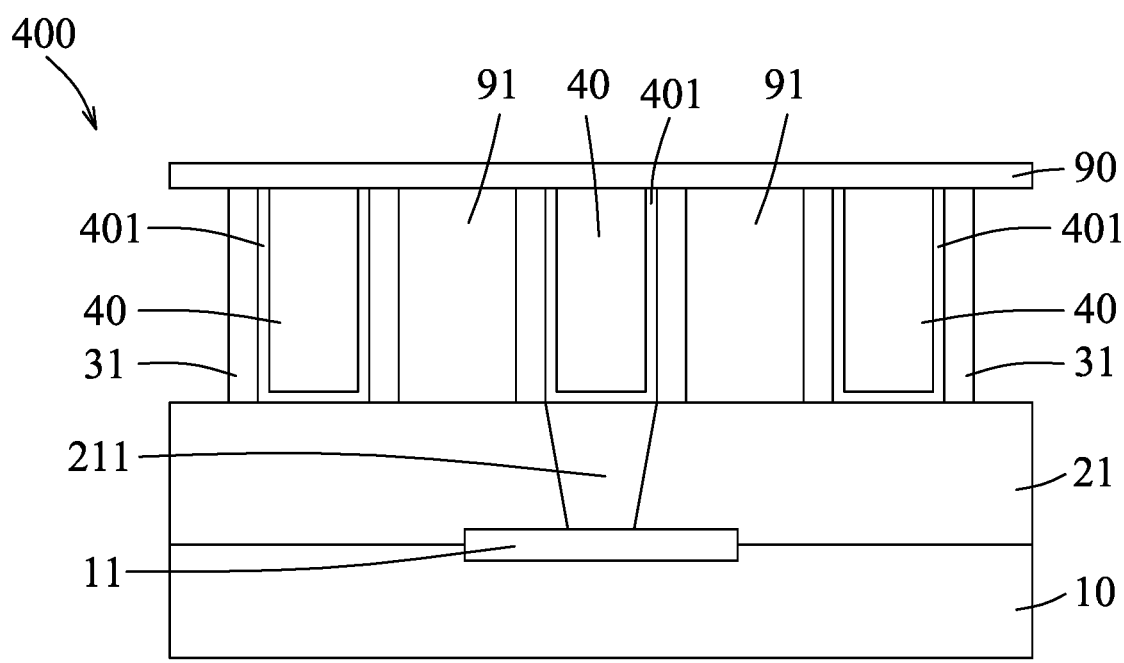

Referring to the example illustrated in FIG. 36, the semiconductor structure 400 in some embodiments includes the interconnect layer 21 disposed on the substrate 10, a plurality of the electrically conductive features 40, a plurality of the spacer layers 31, and the sustaining layer 90. The interconnect layer 21 includes the interconnect 211 (for example, electrically conductive via contact) which is electrically connected to the active region 11 of the substrate 10. The electrically conductive features 40 extend upwardly from the interconnect layer 21 and are spaced apart from each other. One of the electrically conductive features 40 is electrically connected to the interconnect 211. The spacer layers 31 extend upwardly from the interconnect layer 21 along the electrically conductive features 40 to laterally cover the electrically conductive features 40 so as to define a plurality of the air gaps 91. The sustaining layer 90 is configured as a flat layer disposed above the electrically conductive features 40 and the spacer layers 31 to cover the air gaps 91. The sustaining layer 90 provides good mechanical strength for preventing the air gaps 91 from damage. The air gaps 91 formed in the semiconductor structure 400 have heights which are the substantially same as those of the electrically conductive features 40.

Figure 37:
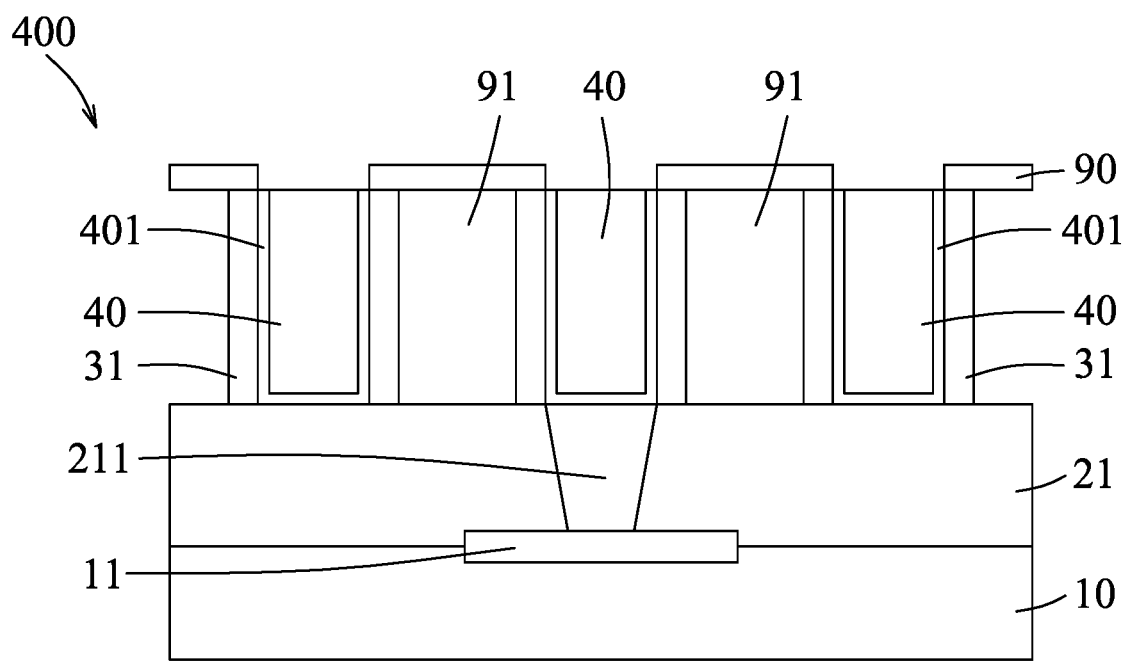
FIGS. 37 to 42 illustrate schematic views showing additional stages for further processing the semiconductor structure having air gaps manufactured in accordance with some embodiments.

Referring to the example illustrated in FIG. 37, the semiconductor structure 40 may be further processed by subjecting the sustaining layer 90 to patterning using photolithography and photoresist developing technology as is known to those skilled in the art of semiconductor fabrication, so as to permit the electrically conductive features 40 to be exposed.

Figure 38:
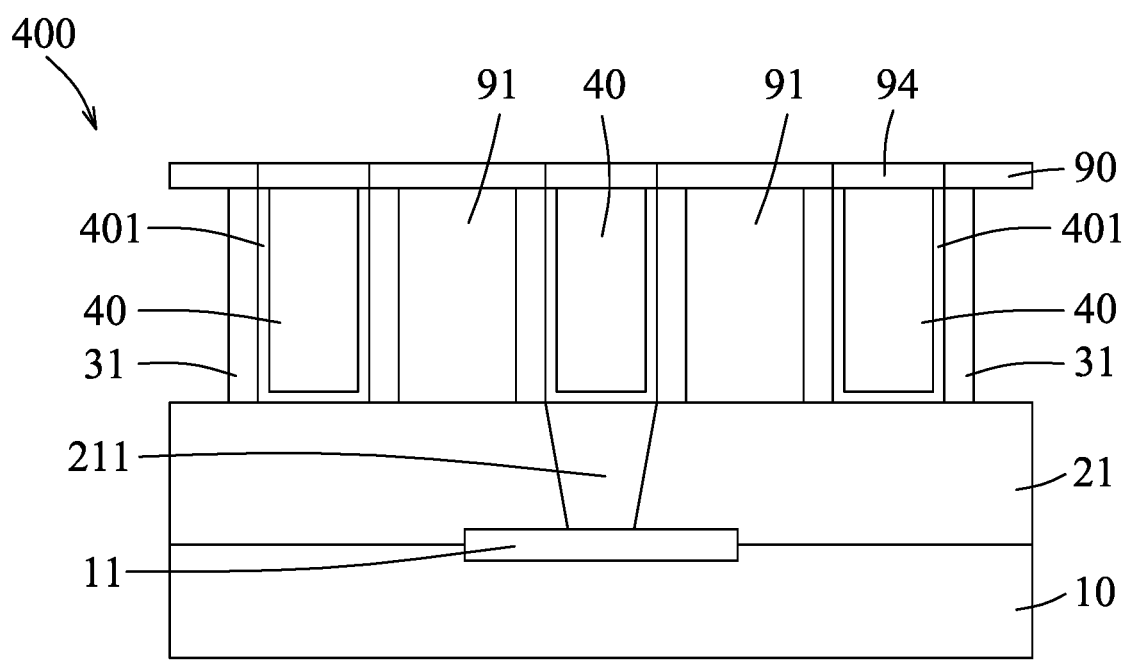

Referring to the example illustrated in FIG. 38, a metal capping layer 94, such as the cobalt capping layer, may then be selectively deposited on the electrically conductive features 40 by a suitable deposition process, such as CVD, using the organometal compound, such as the organocobalt compound, as a precursor.

Figure 39:
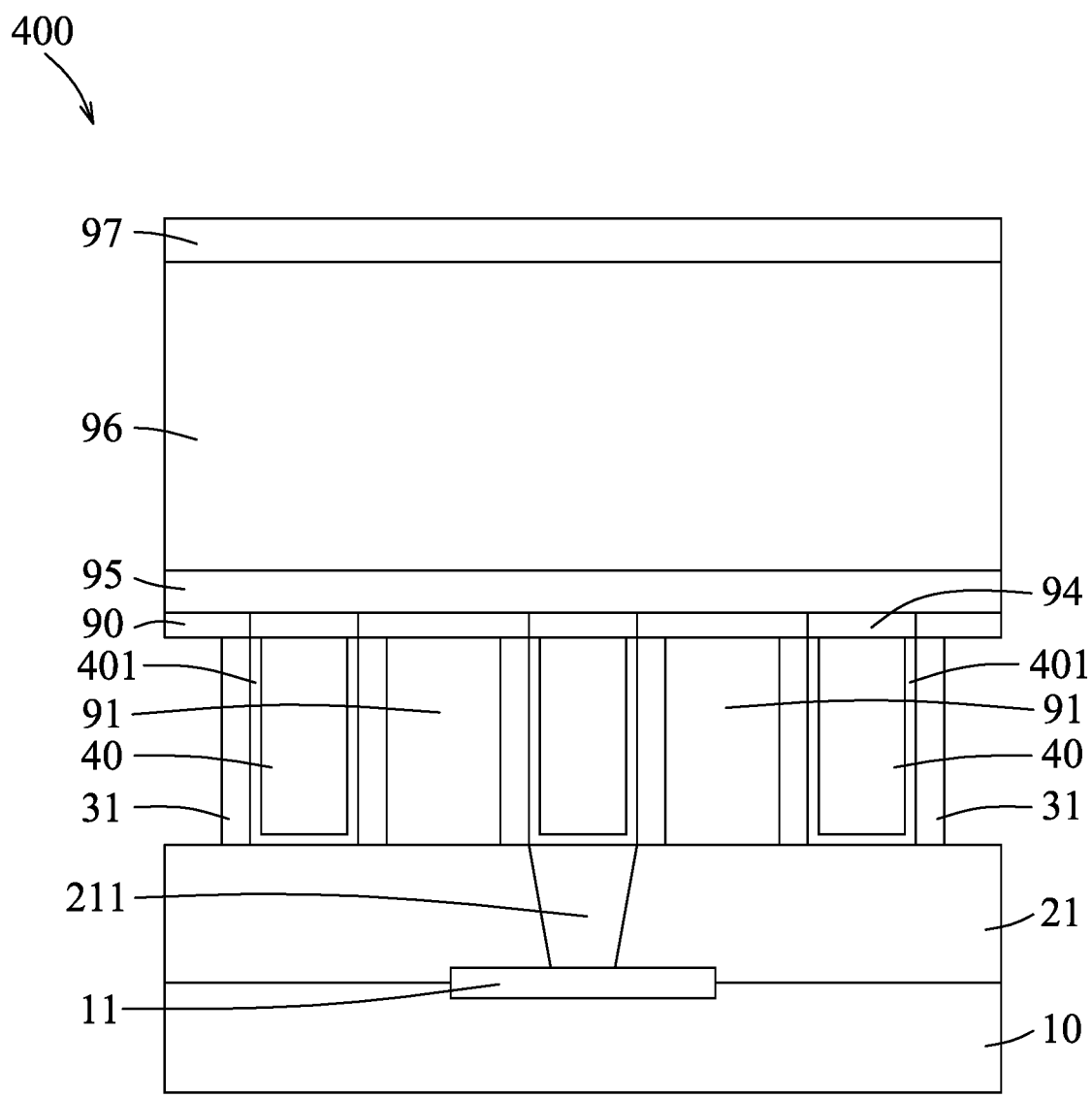

Referring to the example illustrated in FIG. 39, another etch stop layer 95, another dielectric layer 96, and another mask layer 97 are then deposited sequentially on the top surface of the semiconductor structure 400. Details regarding the sequential deposition of the another etch stop layer 95, the another dielectric layer 96, and the another mask layer 97 are the same as or similar to those described above with reference to FIG. 18.

Figure 40:
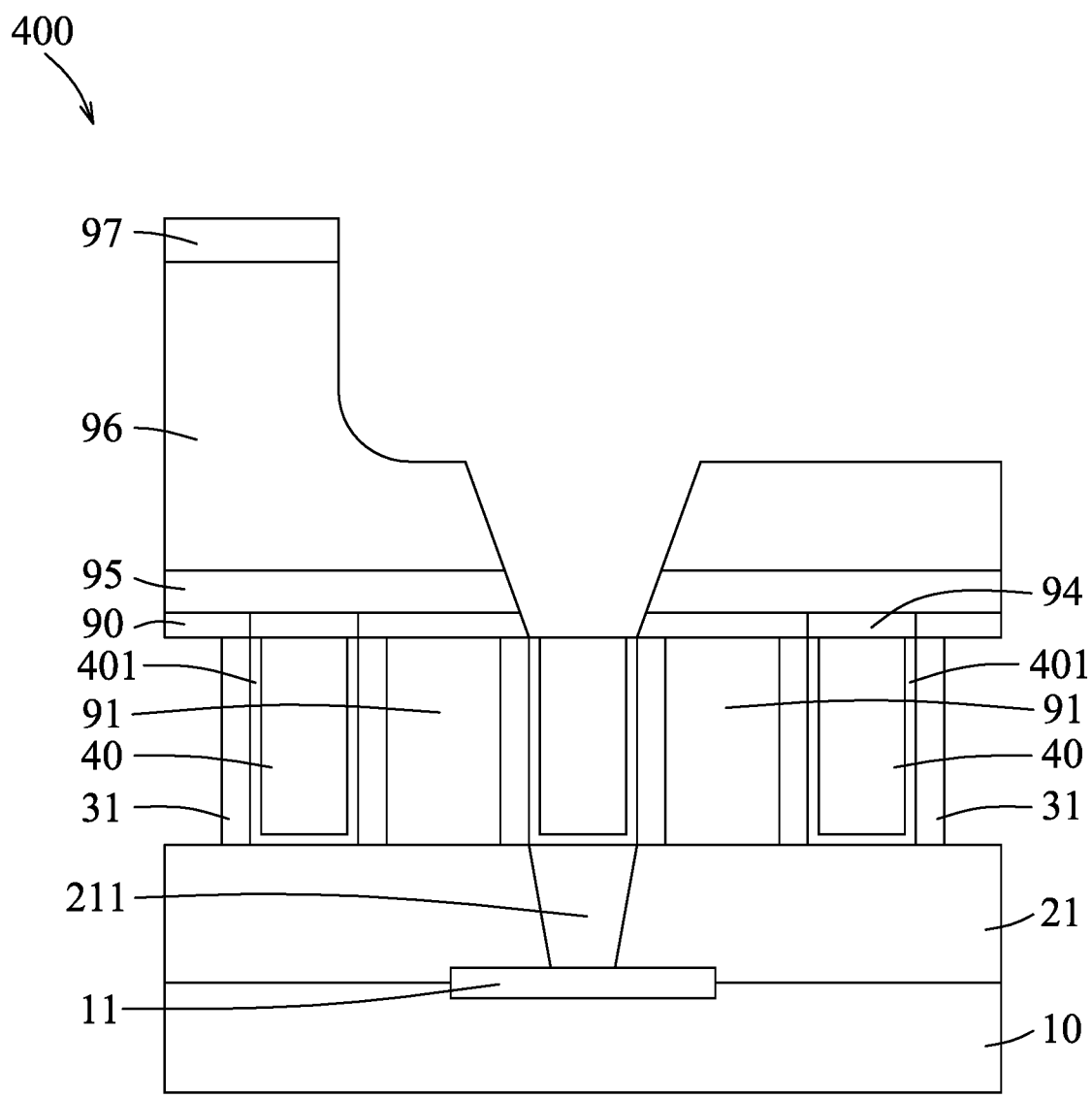

Referring to FIG. 40, the another mask layer 97 is patterned using photolithography and photoresist developing technology as is known to those skilled in the art of semiconductor fabrication. The process for patterning the another mask layer 97 is the same or similar to that described above with reference to FIG. 19, and is not further described in details.

Figure 41:
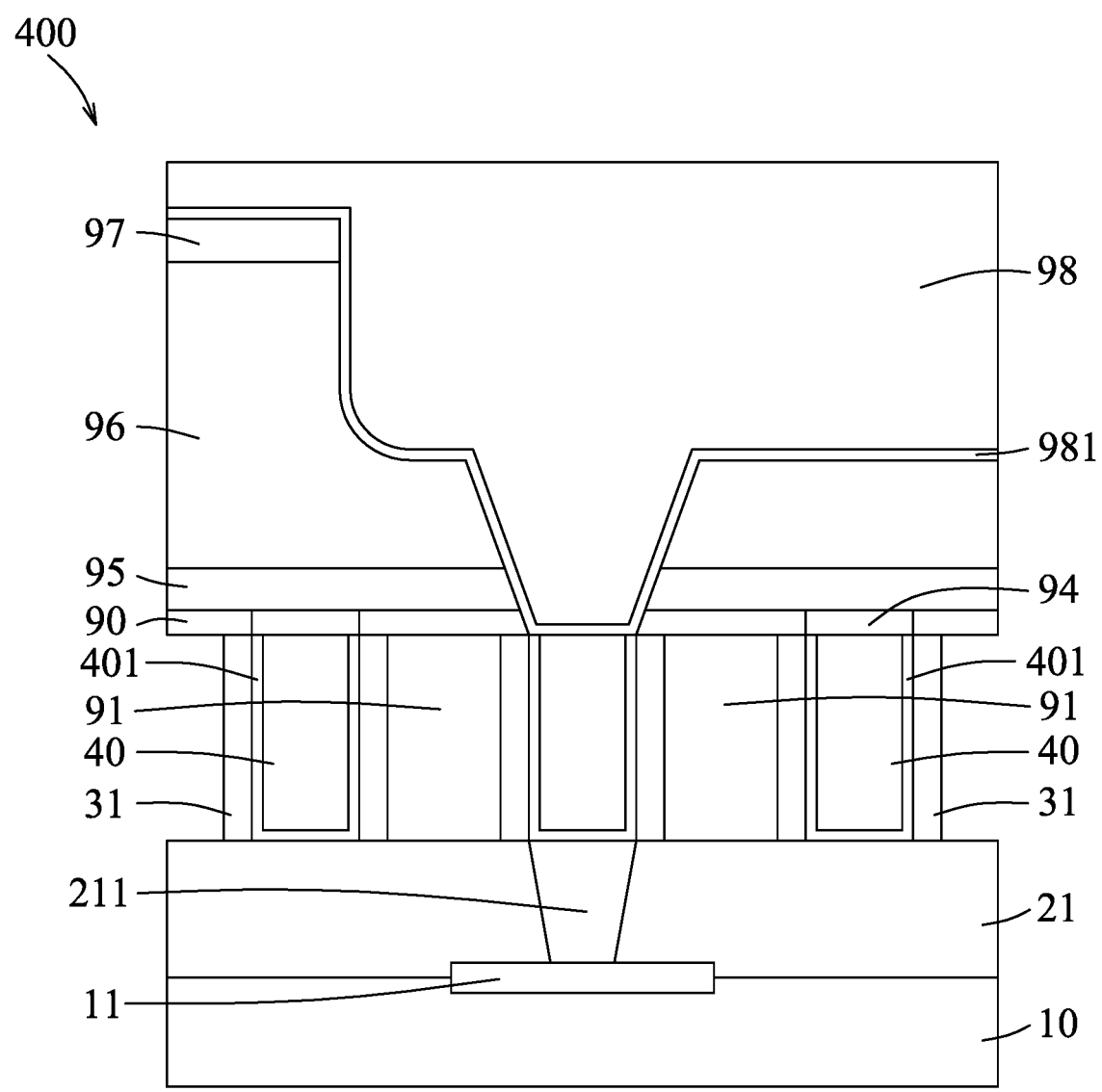

Referring to FIG. 41, at least one another electrically conductive feature 98 (for example, a via contact) is formed to be electrically connected to the at least one electrically conductive features 40. Details regarding the formation of the at least one another electrically conductive feature 98 are the same as or similar to those described above with reference to FIG. 20.

Figure 42:
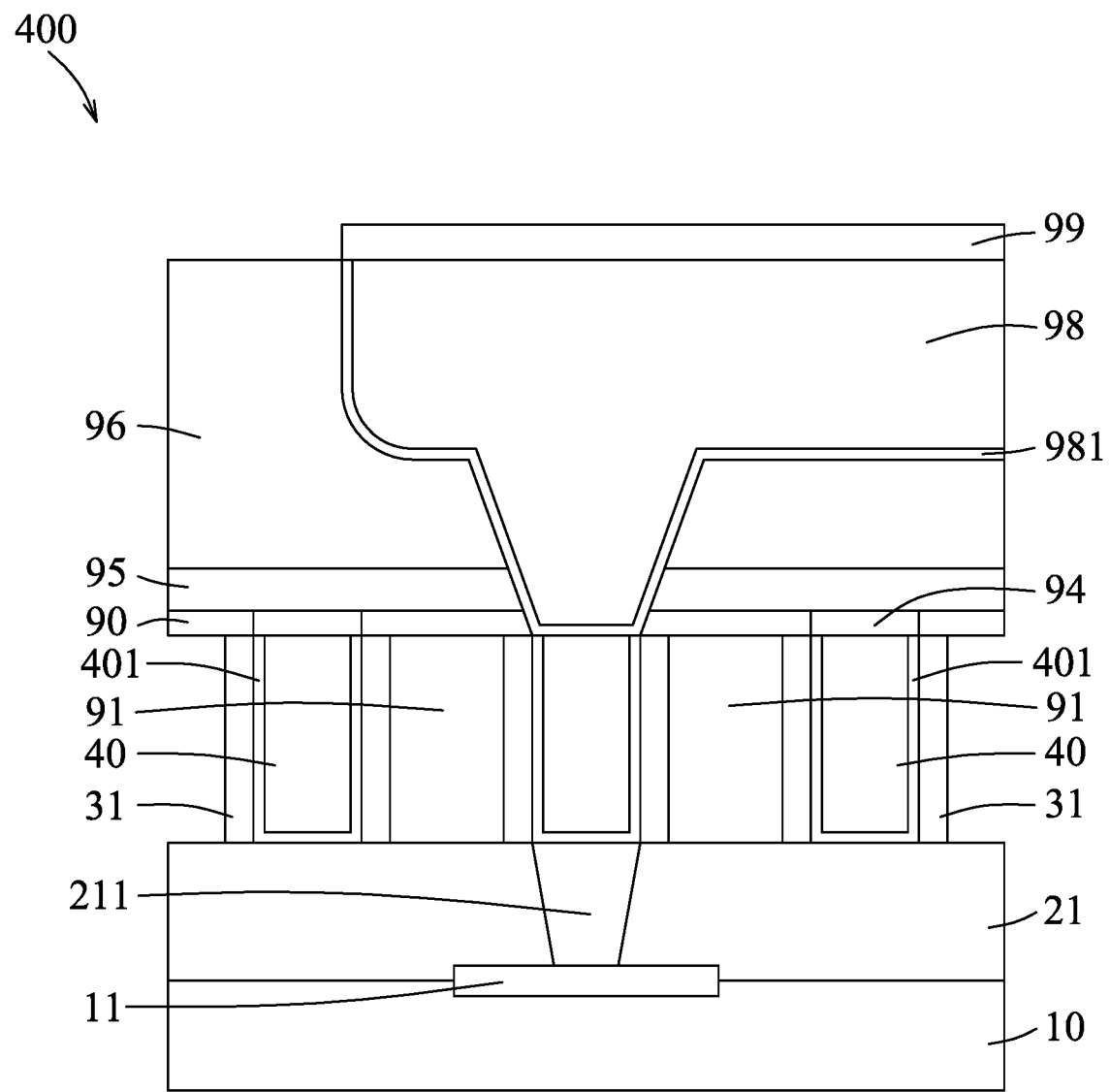
Figure 43:
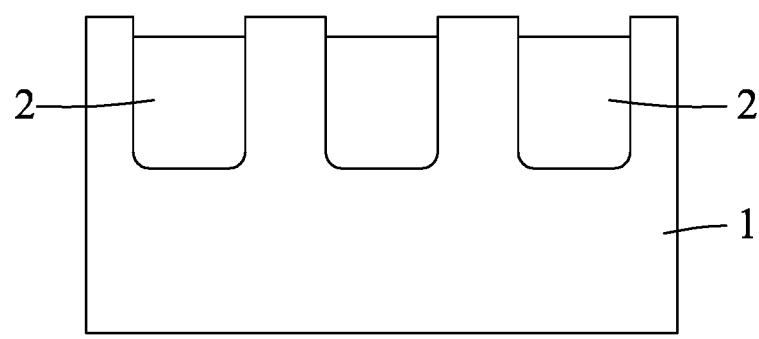
FIGS. 43 to 50 illustrate schematic views showing intermediate stages of a method for forming air gaps in a semiconductor device in accordance with some embodiments.
Figure 44:
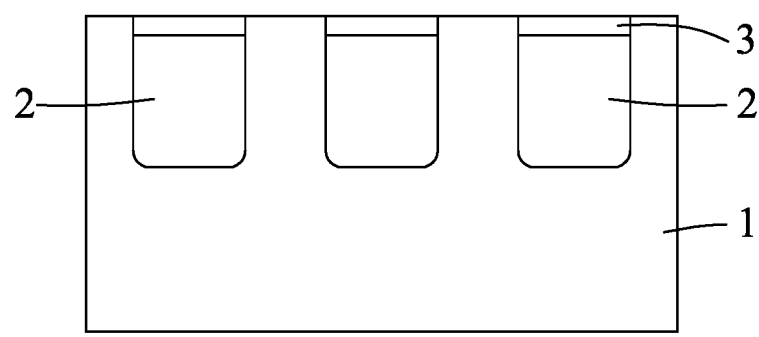
Figure 45:
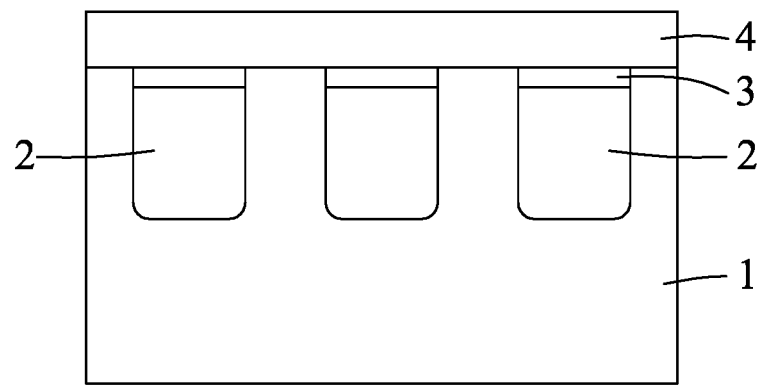
Figure 46:
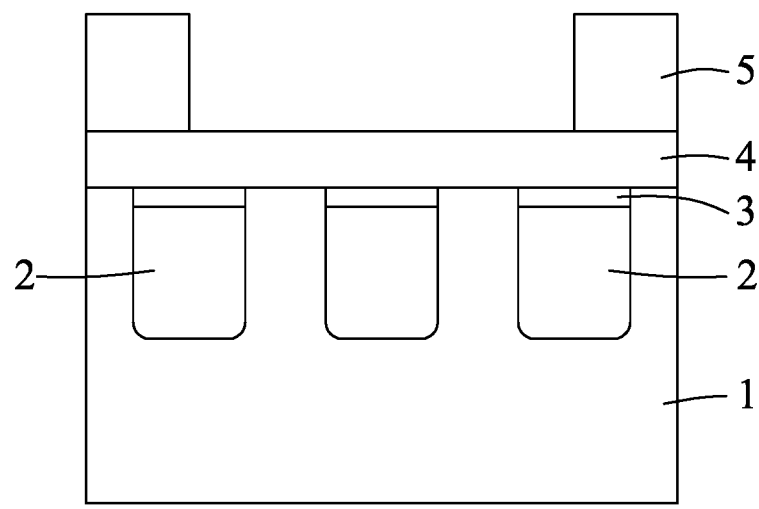
Figure 47:
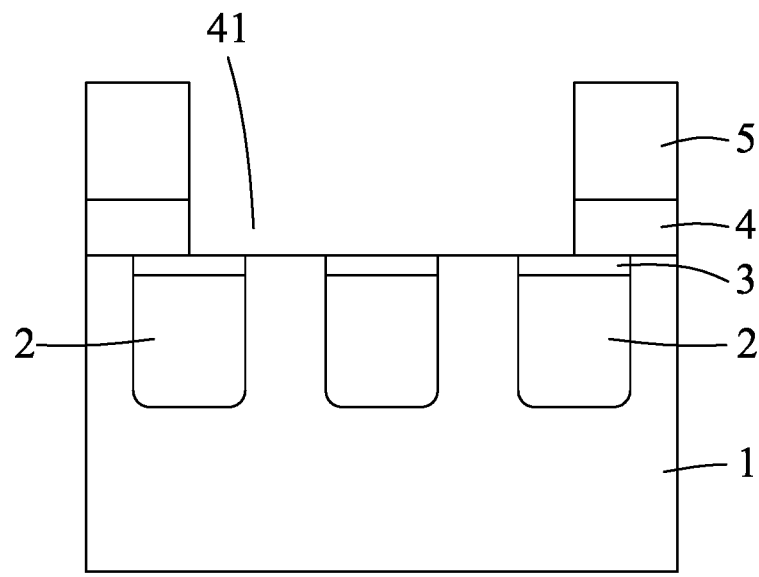
Figure 48:
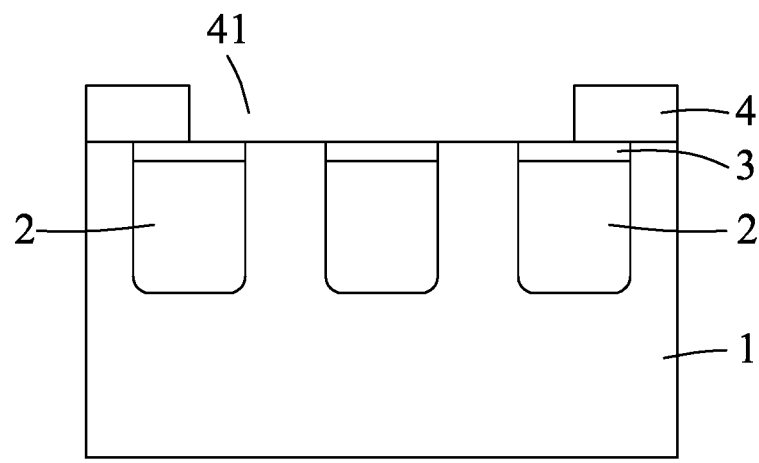
Figure 49:
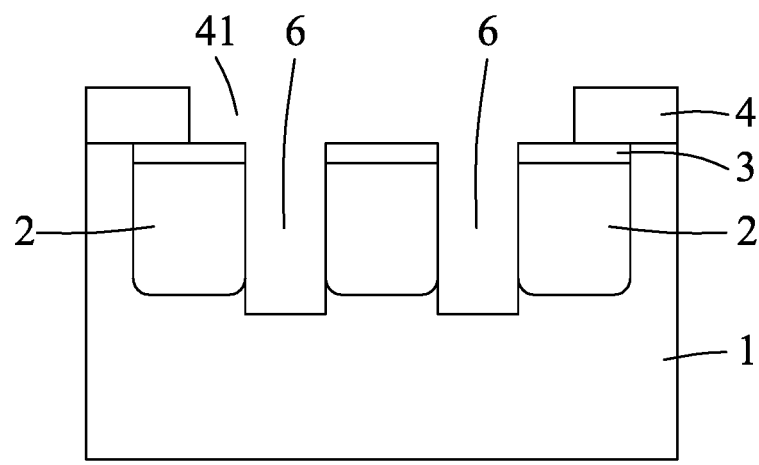
Figure 50:
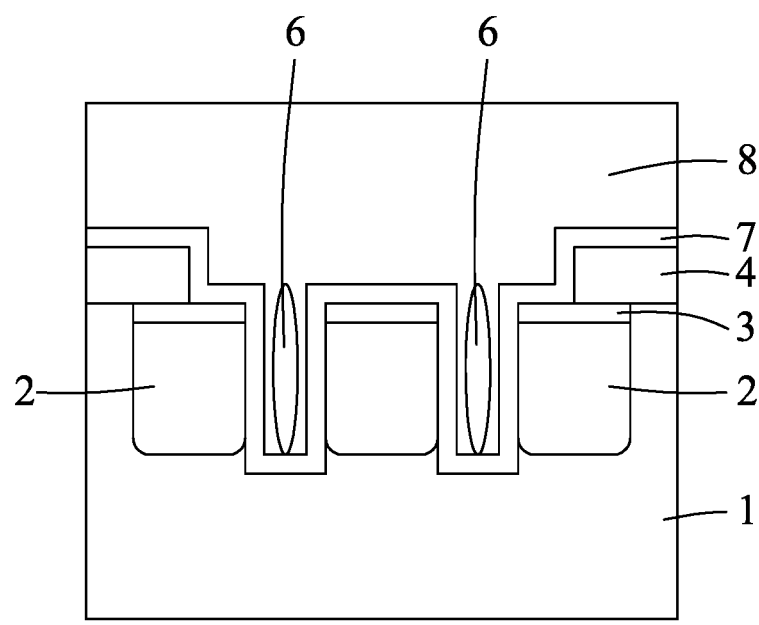

Referring to FIG. 42, the at least one another electrically conductive feature 98 is subjected to planarization, such as CMP, to permit the another dielectric layer 96 to be exposed. Another metal capping layer 99, such as a cobalt capping layer, may then be selectively deposited on the at least one another electrically conductive features 98 by a suitable selective deposition method, such as CVD, using an organometal compound, such as an organocobalt compound, as a precursor.

Referring to FIGS. 43 to 50, a method for manufacturing a semiconductor structure having air gaps in accordance with some embodiments includes the steps of preparing on a substrate (not shown) a low-k dielectric layer 1 formed with electrically conductive features 2 (for example, electrically conductive metal lines), subjecting the low-k dielectric layer 1 formed with the electrically conductive features 2 to a planarization treatment (for example, chemical mechanical planarization (CMP)), selectively depositing a patterned metal capping layer 3 on the electrically conductive features 2, depositing an etch stop layer 4 on the low-k dielectric layer 1 and the patterned metal capping layer 3, forming a patterned hard mask 5 on the etch stop layer 4, subjecting the etch stop layer 4 to patterning by etching through the patterned hard mask 5 to form a pattern opening 41 in the etch stop layer 4, removing the patterned hard mask 5, forming recesses 6 among the electrically conductive features 2 in the low-k dielectric layer 1 by, for example etching through the pattern opening 41 of the etch stop layer 4, depositing a dielectric cap layer 7 to cover the low-k dielectric layer 1, the electrically conductive features 2, the patterned metal capping layer 3, and the etch stop layer 4, and depositing another low-k dielectric layer 8 to form air gaps 9 among the electrically conductive features 2. The etching for patterning the etch stop layer 4 and the etching for forming the recesses 6 may be implemented by, for example, dry plasma etching with an etching gas, such as oxygen, argon, a fluorine-containing gas (for example, $C_4F_8$, $C_5F_8$, $C_4F_6$, $CHF_3$).

By using the thermal degradable material to form the sacrificial features 80, formation of the air gaps 91 in the semiconductor structure 200, 400 can be well controlled. In addition, the spacer layers 31 formed from the first low-k dielectric material laterally cover the electrically conductive features 40 and the capping layer 60 is formed on the electrically conductive features 40 by subjecting the electrically conductive features 40 to selective deposition of the dielectric material, such that the electrically conductive features 40 are covered and protected by the capping layer 60 and the spacer layers 31 so as to prevent the electrically conductive features 30 from damage, such as metal ion residual, which may cause reliability issue, such as time dependent dielectric breakdown (TDDB). Furthermore, the sustaining layer 90 provides good mechanical strength for preventing the air gaps 91 from damage. Therefore, the resistance-capacitance (RC) performance of the semiconductor structure 200, 400 can be further boosted.

In accordance with some embodiments of the present disclosure, a method for manufacturing a semiconductor structure includes preparing a dielectric structure which is formed with trenches respectively defined by lateral surfaces of the dielectric structure; forming spacer layers on the lateral surfaces of the dielectric structure; filling an electrically conductive material into the trenches to form electrically conductive features; selectively depositing a blocking layer on the dielectric structure in such a manner that the electrically conductive features are exposed from the blocking layer; selectively depositing a dielectric material on the exposed electrically conductive features to form a capping layer such that the electrically conductive features are covered by the capping layer and the spacer layers; removing the blocking layer and the dielectric structure to form a plurality of recesses defined by the spacer layers; filling a sacrificial material into the recesses so as to form sacrificial features; forming a sustaining layer to cover the sacrificial features; and removing the sacrificial features to form air gaps confined by the sustaining layer and the spacer layers.

In accordance with some embodiments of the present disclosure, a method for manufacturing a semiconductor structure includes forming an interconnect layer on a substrate; forming a plurality of trenches on a dielectric structure, the trenches being respectively defined by lateral surfaces of the dielectric structure; form spacer layers on the lateral surfaces of the dielectric structure; filling an electrically conductive material into the trenches to form electrically conductive features; selectively depositing a blocking layer on the dielectric structure in such a manner that the electrically conductive features are exposed from the blocking layer; selectively depositing a dielectric material on the exposed electrically conductive features to form a capping layer such that the electrically conductive features are covered by the capping layer and the spacer layers; removing the blocking layer and the dielectric structure to form a plurality of recesses defined by the spacer layers; filling a sacrificial material into the recesses so as to form sacrificial features; forming a porous sustaining layer covering the sacrificial features; and removing the sacrificial features to form air gaps confined by the sustaining layer and the spacer layers.

In accordance with some embodiments of the present disclosure, a semiconductor structure includes a substrate, an interconnect layer, a plurality of electrically conductive features, a plurality of spacer layers, and a porous sustaining layer. The substrate includes at least one electrically conductive element. The interconnect layer is disposed on the substrate and includes at least one interconnect in contact with the at least one electrically conductive element. The electrically conductive features are spaced apart from each other and at least one of the electrically conductive features is in contact with the at least one interconnect. The spacer layers laterally cover the electrically conductive features to form a plurality of air gaps defined by the spacer layers. The porous sustaining layer is disposed over the electrically conductive features and covers the spacer layers and the air gaps.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    preparing a dielectric structure which is formed with trenches respectively defined by lateral surfaces of the dielectric structure;
    forming spacer layers on the lateral surfaces of the dielectric structure;
    filling an electrically conductive material into the trenches to form electrically conductive features;
    selectively depositing a blocking layer on the dielectric structure in such a manner that the electrically conductive features are exposed from the blocking layer;
    selectively depositing a dielectric material on the exposed electrically conductive features to form a capping layer such that the electrically conductive features are covered by the capping layer and the spacer layers;
    removing the blocking layer and the dielectric structure to form a plurality of recesses defined by the spacer layers;
    filling a sacrificial material into the recesses so as to form sacrificial features;
    forming a sustaining layer to cover the sacrificial features; and
    removing the sacrificial features to form air gaps confined by the sustaining layer and the spacer layers.

2. The method according to claim 1, wherein forming the spacer layers includes:
    conformally forming a dielectric deposition layer on the dielectric structure; and
    anisotropically etching the dielectric deposition layer to form the spacer layers.

3. The method according to claim 1, wherein forming the sacrificial features includes:
    filling the sacrificial material into the recesses; and
    anisotropically etching the sacrificial material until the sacrificial features each having a predetermined height less than a height of each of the electrically conductive features are formed in the recesses.

4. The method according to claim 1, wherein forming the sacrificial features includes:
    filling the sacrificial material into the recesses such that a cap layer made of the sacrificial material is formed to fill the recesses and to cover the capping layer and the spacer layers; and
    removing the capping layer and the cap layer to form the sacrificial features having top surfaces substantially horizontally flush with those of the electrically conductive features and the spacer layers.

5. The method according to claim 1, wherein the sacrificial features are removed by a treatment selected from a thermal treatment, an ultraviolet treatment, or a combination thereof.

6. The method according to claim 5, wherein the sacrificial features are removed by the thermal treatment at a temperature ranging from 300° C. to 400° C.

7. The method according to claim 5, wherein the sacrificial features are removed by the ultraviolet treatment at an ultraviolet exposure energy density ranging from 10 mJ/cm$^2$ to 100 J/cm$^2$.

8. The method according to claim 1, wherein the sacrificial material is selected from polyurea, polylactic acid, polycaprolactone, poly(methyl methacrylate), poly(ethylene oxide), or combinations thereof.

9. The method according to claim 1, further comprising, before selectively depositing the blocking layer, planarizing the electrically conductive features so as to permit a patterned dielectric layer of the dielectric structure to be exposed.

10. The method according to claim 9, wherein the blocking layer is selectively deposited on the patterned dielectric layer of the dielectric structure.

11. The method according to claim 10, wherein the blocking layer is made of a compound including a head group which contains silicon or carbon and which is used as an anchor to be bonded to a surface of the patterned dielectric layer.

12. The method according to claim 11, wherein the compound is selected from butyltriethoxysilane, cyclohexyltrimethoxysilane, cyclopentyltrimethoxysilane, dodecyltriethoxysilane, dodecyltrimethoxysilane, decyltriethoxysilane, dimethoxy(methyl)-n-octylsilane, triethoxyethylsilane, ethyltrimethoxysilane, hexyltrimethoxysilane, hexyltriethoxysilane, hexadecyltrimethoxysilane, hexadecyltriethoxysilane, triethoxymethylsilane, trimethoxy(methyl)silane, methoxy(dimethyl)octadecylsilane, methoxy(dimethyl)-n-octylsilane, octadecyltriethoxysilane, triethoxy-n-octylsilane, octadecyltrimethoxysilane, trimethoxy(propyl)silane, trimethoxy-n-octylsilane, triethoxy(propyl)silane, methane, ethane, propane, butane, pentane, hexane, heptane, octane, nonane, decane, undecane, dodecane, pentadecane, hexadecane, or combinations thereof.

13. The method according to claim 1, wherein the sustaining layer is porous.

14. The method according to claim 1, wherein the sustaining layer is made of a porous silicon-based material selected from silicon oxide, silicon oxycarbide, silicon oxynitride, silicon carbonitride, silicon oxycarbonitride, or combinations thereof.

15. A method for manufacturing a semiconductor structure, comprising:
    forming an interconnect layer on a substrate;
    forming a plurality of trenches on a dielectric structure disposed on the interconnect, the trenches being respectively defined by lateral surfaces of the dielectric structure;
    forming spacer layers on the lateral surfaces of the dielectric structure;
    filling an electrically conductive material into the trenches to form electrically conductive features;
    selectively depositing a blocking layer on the dielectric structure in such a manner that the electrically conductive features are exposed from the blocking layer;
    selectively depositing a dielectric material on the exposed electrically conductive features to form a capping layer such that the electrically conductive features are covered by the capping layer and the spacer layers;

removing the blocking layer and the dielectric structure to form a plurality of recesses defined by the spacer layers;

filling a sacrificial material into the recesses so as to form sacrificial features;

forming a porous sustaining layer covering the sacrificial features; and removing the sacrificial features to form air gaps confined by the sustaining layer and the spacer layers.

16. The method according to claim 15, further comprising, before selectively depositing the blocking layer, planarizing the electrically conductive features to permit a patterned dielectric layer of the dielectric structure to be exposed such that the blocking layer is selectively deposited on the patterned dielectric layer.

17. The method according to claim 16, wherein the blocking layer is made of a compound including a head group which contains silicon or carbon and which is used as an anchor to be bonded to a surface of the patterned dielectric layer.

18. A method for manufacturing a semiconductor structure, comprising:

preparing a dielectric structure on a substrate, the dielectric structure includes a patterned dielectric layer and is formed with trenches respectively defined by lateral surfaces of the dielectric structure;

forming spacer layers on the lateral surfaces of the dielectric structure;

filling an electrically conductive material into the trenches to form electrically conductive features;

selectively depositing a blocking layer on the dielectric structure in such a manner that the electrically conductive features are exposed from the blocking layer;

selectively depositing a dielectric material on the exposed electrically conductive features to form a capping layer such that the electrically conductive features are covered by the capping layer and the spacer layers; and removing the blocking layer and the dielectric structure to form a plurality of recesses defined by the spacer layers.

19. The method according to claim 18, further comprising:

filling a sacrificial material into the recesses so as to form sacrificial features;

forming a sustaining layer to cover the sacrificial features; and removing the sacrificial features to form air gaps confined by the sustaining layer and the spacer layers.

20. The method according to claim 19, wherein the sustaining layer is porous.

* * * * *